US010989887B2

(12) United States Patent
Lim et al.

(10) Patent No.: US 10,989,887 B2
(45) Date of Patent: Apr. 27, 2021

(54) PHOTONIC INTEGRATED CIRCUIT PACKAGE AND METHOD OF FORMING THE SAME

(71) Applicant: Agency for Science, Technology and Research, Singapore (SG)

(72) Inventors: Teck Guan Lim, Singapore (SG); Surya Bhattacharya, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/642,336

(22) PCT Filed: Sep. 3, 2018

(86) PCT No.: PCT/SG2018/050445
§ 371 (c)(1),
(2) Date: Feb. 26, 2020

(87) PCT Pub. No.: WO2019/050477
PCT Pub. Date: Mar. 14, 2019

(65) Prior Publication Data
US 2020/0310052 A1    Oct. 1, 2020

(30) Foreign Application Priority Data
Sep. 6, 2017  (SG) .......................... 10201707236R

(51) Int. Cl.
*G02B 6/12*    (2006.01)
*G02B 6/42*    (2006.01)
(Continued)

(52) U.S. Cl.
CPC ......... *G02B 6/4255* (2013.01); *G02B 6/4204* (2013.01); *H01L 24/16* (2013.01);
(Continued)

(58) Field of Classification Search
CPC .... G02B 6/4255; G02B 6/4204; G02B 6/426; H01L 24/16; H01L 25/165; H01L 25/167;
(Continued)

(56) References Cited

U.S. PATENT DOCUMENTS 5,969,461 A   10/1999  Anderson et al.
6,140,144 A   10/2000  Najafi et al.
(Continued)

FOREIGN PATENT DOCUMENTS

CN        1956178 A     5/2007
CN      101521194 A     9/2009

OTHER PUBLICATIONS

International Search Report for International Application No. PCT/SG2018/050445 dated Nov. 2, 2018, pp. 1-4.
(Continued)

*Primary Examiner* — Ellen E Kim
(74) *Attorney, Agent, or Firm* — Winstead PC

(57) ABSTRACT

Various embodiments may relate to a method of forming a photonic integrated circuit package (PIC). The method may include forming a redistribution layer (RDL) over a carrier. The method may also include forming a through hole or cavity on the redistribution layer. The method may additionally include providing a stop-ring structure, the stop-ring structure including a ring of suitable material, the stop-ring structure defining a hollow space, over the redistribution layer so that the hollow space is over the through hole or cavity. The method may further include arranging a photonic integrated circuit (PIC) die over the redistribution layer so that the photonic integrated circuit (PIC) die is on the stop-ring structure. The method may also include forming a molded package by forming a mold structure to at least partially cover the photonic integrated circuit (PIC) die to form the photonic integrated circuit package.

18 Claims, 20 Drawing Sheets

(51) Int. Cl.
  *H01L 23/00* (2006.01)
  *H01L 25/16* (2006.01)
(52) U.S. Cl.
  CPC .......... *H01L 25/165* (2013.01); *H01L 25/167* (2013.01); *H01L 2224/16227* (2013.01)
(58) Field of Classification Search
  CPC . H01L 2224/16227; H01L 2224/92125; H01L 2924/15311; H01L 2224/73204; H01L 2224/1403; H01L 2924/181; H01L 2224/16225; H01L 2924/15151; H01L 21/568; H01L 2223/54426; H01L 2223/54473; H01L 21/56; H01L 23/16; H01L 23/3128; H01L 23/544
  See application file for complete search history.

(56) References Cited

U.S. PATENT DOCUMENTS

| | | | |
|---|---|---|---|
| 6,600,213 | B2 | 7/2003 | Brouillette et al. |
| 6,982,491 | B1 | 1/2006 | Fan et al. |
| 7,042,106 | B2 | 5/2006 | Lu et al. |
| 8,690,397 | B2 | 4/2014 | Muraguchi |
| 8,791,492 | B2 | 7/2014 | Ju et al. |
| 9,159,861 | B2 | 10/2015 | Zhang et al. |
| 9,606,291 | B2 * | 3/2017 | Ellis-Monaghan ...... G02B 6/30 |
| 9,607,863 | B1 | 3/2017 | Lee |
| 2004/0100164 | A1 | 5/2004 | Murata et al. |
| 2005/0189631 | A1 | 9/2005 | Masumoto |
| 2010/0087024 | A1 | 4/2010 | Hawat et al. |
| 2011/0304015 | A1 * | 12/2011 | Kim ...................... H01L 25/105 257/532 |
| 2014/0269804 | A1 * | 9/2014 | Lai ...................... H01S 5/02248 372/50.21 |
| 2015/0214074 | A1 * | 7/2015 | Liu ........................ H01L 23/24 257/692 |
| 2016/0109668 | A1 | 4/2016 | Pfnuer et al. |
| 2016/0377821 | A1 * | 12/2016 | Vallance ................ G02B 6/124 385/28 |
| 2017/0254968 | A1 * | 9/2017 | Ding ...................... H01L 24/81 |

OTHER PUBLICATIONS

Written Opinion of the International Searching Authority for International Application No. PCT/SG2018/050445 dated Nov. 2, 2018, pp. 1-5.

International Preliminary Report on Patentability for International Application No. PCT/SG2018/050445 dated Sep. 26, 2019, pp. 1-18.

* cited by examiner

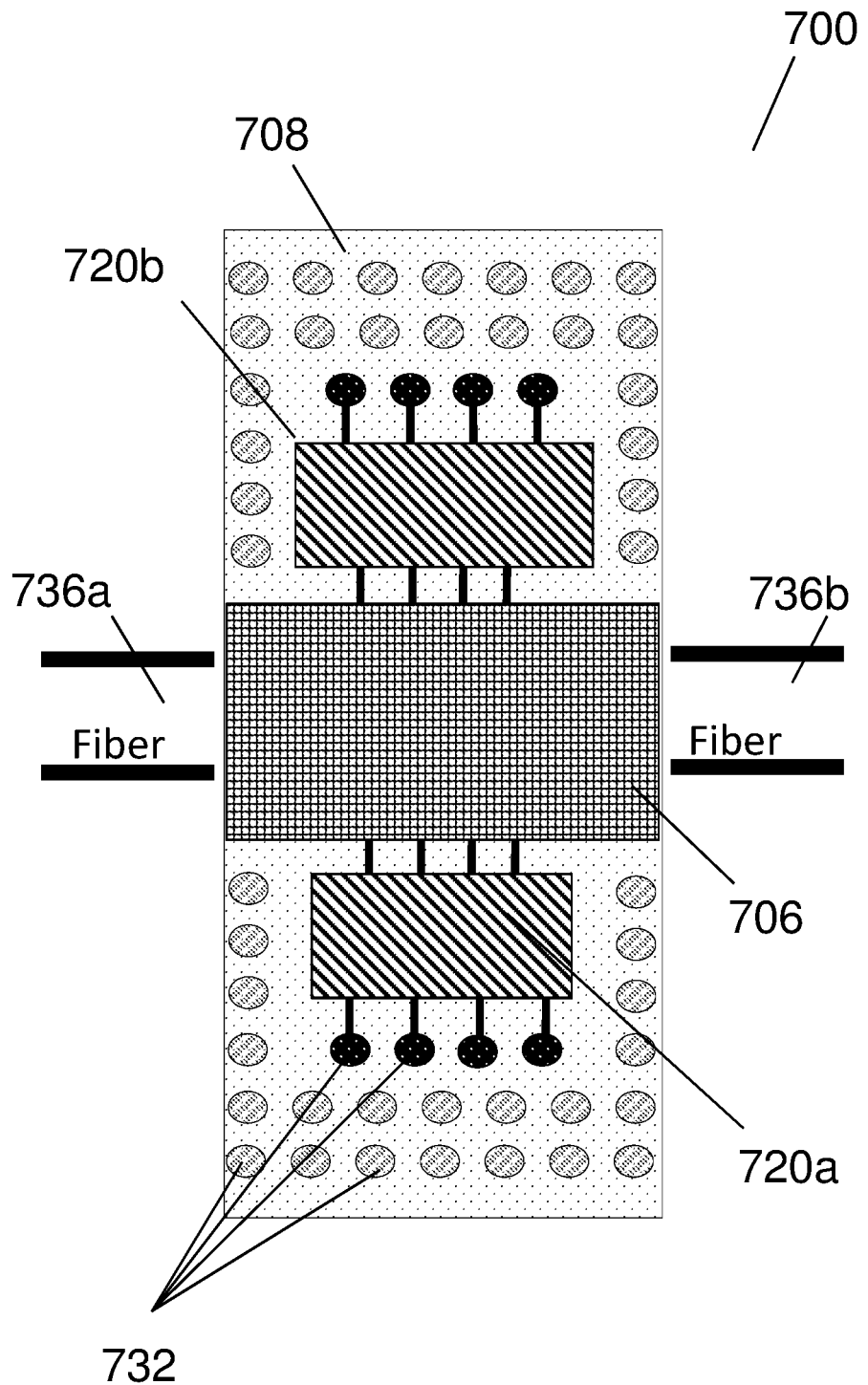

PHOTONIC INTEGRATED CIRCUIT PACKAGE AND METHOD OF FORMING THE SAME

CROSS-REFERENCE TO RELATED APPLICATION

This application claims the benefit of priority of Singapore application No. 10201707236R filed on Sep. 6, 2017, the contents of it being hereby incorporated by reference in its entirety for all purposes.

TECHNICAL FIELD

Various aspects of this disclosure relate to a photonic integrated circuit package. Various aspects of this disclosure relate to a method of forming a photonic integrated circuit package.

BACKGROUND

The current aggregated speed of the optical transceiver is 100 gigabits per second (Gbps), and the speed per channel is 25 Gbps. The per channel speed is expected to be increased to 56 Gbps. The main photonic components that can operate at such speeds have been demonstrated by a number of research institutes and commercial companies.

High speed integration and low cost are becoming important factors in optical transceiver design. The direct integration of chip on board using wire bonds is cost effective, but high inductance limits the electrical bandwidth, typically in the range of 20 GHz. This may result in severe signal distortion.

An alternative is the fabrication of through silicon vias (TSVs) on the photonic integrated circuit (PIC), and attachment via flip chip assemblies (e.g. with solder bumps). This in theory can support very high speeds as the Silicon-On-Insulator (SOI) wafer used for the PIC has high resistivity characteristics. However, the fabrication of the TSVs on the PIC is a complicated process, and is not cost effective.

SUMMARY

Various embodiments may relate to a method of forming a photonic integrated circuit package (PIC). The method may include forming a redistribution layer (RDL) over a carrier. The method may also include forming a through hole or cavity on the redistribution layer. The method may additionally include providing a stop-ring structure, the stop-ring structure including a ring of suitable material, the stop-ring structure defining a hollow space, over the redistribution layer so that the hollow space is over the through hole or cavity. The method may further include arranging a photonic integrated circuit (PIC) die over the redistribution layer so that the photonic integrated circuit (PIC) die is on the stop-ring structure. The method may also include forming a molded package by forming a mold structure to at least partially cover the photonic integrated circuit (PIC) die to form the photonic integrated circuit package.

Various embodiments relate to a photonic integrated circuit package. The photonic integrated circuit package may include a redistribution layer (RDL). The photonic integrated circuit package may also include a stop-ring structure over the redistribution layer. The photonic integrated circuit package may further include a photonic integrated circuit die over the redistribution layer so that the photonic integrated circuit die is on the stop-ring structure. The photonic integrated circuit package may further include a mold structure at least partially covering the photonic integrated circuit die.

BRIEF DESCRIPTION OF THE DRAWINGS

The invention will be better understood with reference to the detailed description when considered in conjunction with the non-limiting examples and the accompanying drawings, in which:

FIG. 7 is a schematic showing a top planar view of a photonic integrated circuit package according to various embodiments.

DETAILED DESCRIPTION

Figure 1:
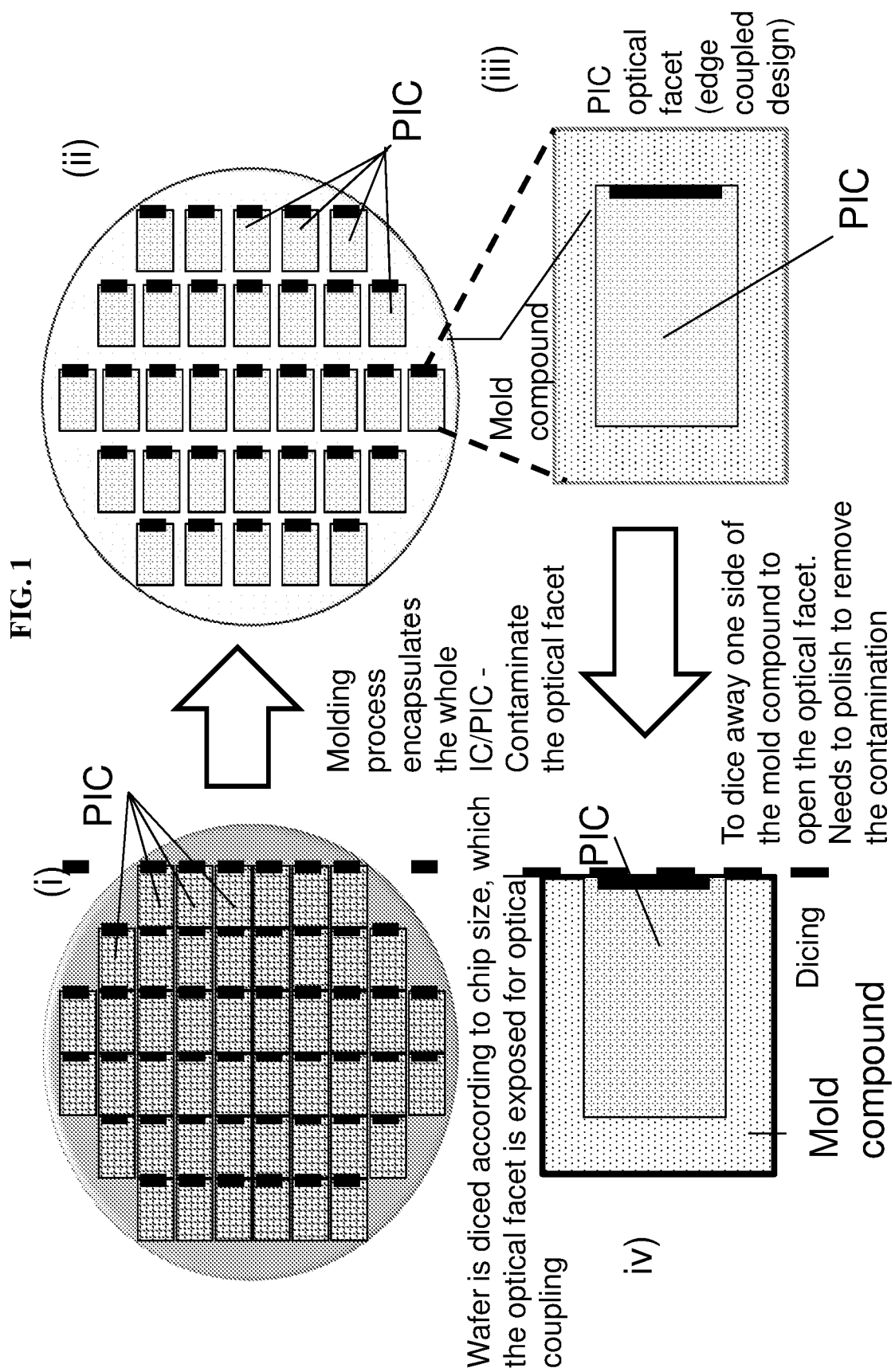
FIG. 1 illustrates expected contamination issues of photonic integrated circuit (PIC) chips.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or packages are analogously valid for the other methods or packages. Similarly, embodiments described in the context of a method are analogously valid for a package, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The package as described herein may be operable in various orientations, and thus it should be understood that the terms "top", "topmost", "bottom", "bottommost" etc., when used in the following description are used for convenience and to aid understanding of relative positions or directions, and not intended to limit the orientation of the package.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may relate to a fanout wafer level package (FOWLP). Various embodiments may relate to an electronic-photonic integrated circuit (EPIC) FOWLP. Various embodiments may operate up to several 100 Gbps. Various embodiments may have a lower cost than the TSV based packages.

Various embodiments may seek to address or mitigate issues faced by conventional PIC packages. Various embodiments may have improved speeds, e.g. compared to wire-bond based packages. Various embodiments may be more cost effective, e.g. compared to TSV based packages.

Forming the FOWLP may include molding the PIC, i.e. forming a mold structure to at least partially cover the photonic integrated circuit (PIC) die.

The key challenge of molding the PIC is to prevent or reduce contamination on the photonic input/output (I/O) facets. FIG. 1 illustrates expected contamination issues of photonic integrated circuit (PIC) chips. In a conventional process, the PIC chips are diced so that the optical facets are exposed for optical coupling (see (i)). Subsequently, as seen in (ii), the PIC chips are molded to encapsulate the chips. In order to avoid clutter and improve clarity, not all the PIC chips have been labelled. The mold material comes into contact with the optical facets, which may result in contamination of the optical facets. (iii) shows one molded PIC chip. The chip may have an edge coupled design. (iv) shows the molded chip in (iii) with a part of the mold material being removed, e.g. by dicing, so that the optical facet of the chip is being exposed. The optical facet would need to be polished to remove the contamination. Polishing may be costly and may not completely remove the contamination.

Various embodiments may seek to prevent or reduce contamination on the photonic input/output (I/O) facets. Various embodiments may provide advantages compared to the process illustrated in FIG. 1

Figure 2:
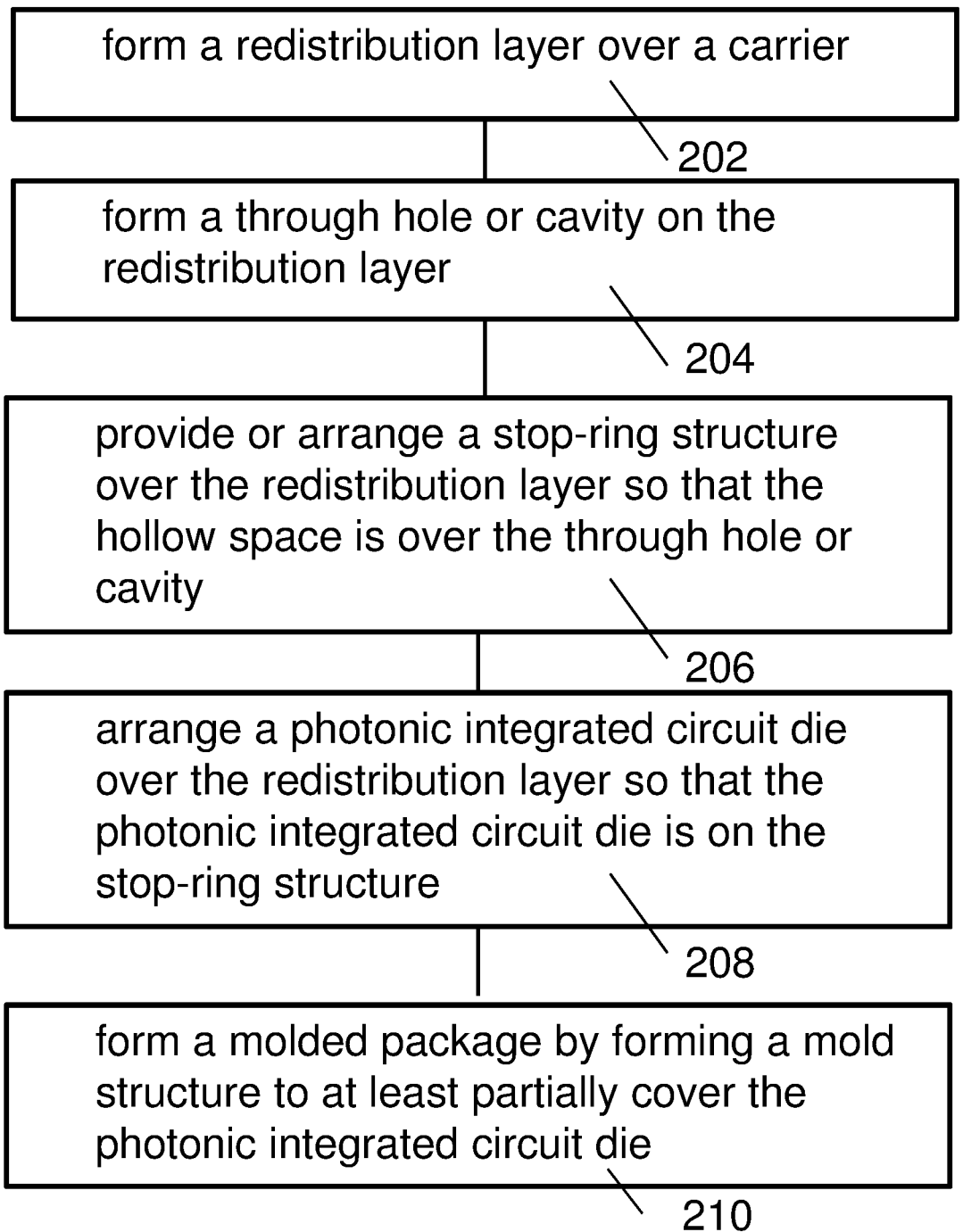
FIG. 2 is a general illustration of a method of forming a photonic integrated circuit package (PIC) according to various embodiments.

Various embodiments may relate to a method of forming a photonic integrated circuit package (PIC). FIG. 2 is a general illustration of a method of forming a photonic integrated circuit package (PIC) according to various embodiments. The method may include, in 202, forming a redistribution layer (RDL) over a carrier. The method may also include, in 204, forming a through hole or cavity on the redistribution layer. The method may additionally include, in 206, providing or arranging a stop-ring structure, the stop-ring structure including a ring of suitable material, the stop-ring structure defining a hollow space, over the redistribution layer so that the hollow space is over the through hole or cavity. The method may further include, in 208, arranging a photonic integrated circuit (PIC) die over the redistribution layer so that the photonic integrated circuit (PIC) die is on the stop-ring structure. The method may also include, in 210, forming a molded package by forming a mold structure to at least partially cover the photonic integrated circuit (PIC) die to form the photonic integrated circuit package.

In other words, a stop-ring structure may be placed over a cavity of through hole previous defined on a redistribution layer. A photonic integrated circuit (PIC) die, i.e. a PIC chip, may be placed on the stop-ring structure. The PIC die may then be molded.

In various embodiments, the photonic integrated circuit die may include one or more optical couplers. Arranging the photonic integrated circuit die over the redistribution layer may include arranging the photonic integrated circuit die so that the one or more optical couplers are at least partially exposed to the hollow space of the stop-ring structure. The one or more optical couplers may be on a main surface of the photonic integrated circuit die.

Each of the one or more optical coupler may have an input/output (I/O) facet.

An optical input/output (I/O) facet may be an input and/or output port or surface in which light is transmitted into the photonic integrated circuit die or out of the photonic integrated circuit die.

In other words, the photonic integrated circuit (PIC) die may be on the stop-ring structure in such a manner that an optical coupler or at least a portion of the optical coupler may be over the hollow space defined by the ring.

The optical coupler may be or may include an optical waveguide.

The stop-ring structure (together with a RDL first approach) may help prevent or reduce the likelihood of under fill material and/or mold material from coming into contact with the optical coupler of the PIC die (top protection).

The method may further include dicing the molded package to form the photonic integrated circuit (PIC) package. Dicing the molded package may include dicing the photonic integrated circuit (PIC) die and the stop-ring structure.

In various embodiments, the photonic integrated circuit die and the stop-ring structure may be diced in such a manner that a surface of the diced stop-ring structure exposed by dicing is substantially perpendicular to the one or more optical couplers of the diced photonic integrated circuit die.

In various embodiments, the one or more optical couplers of the diced photonic integrated circuit die may be substantially perpendicular to a lateral surface of the diced photonic integrated circuit die. The lateral surface may be exposed by dicing of the photonic integrated circuit die.

In various embodiments, dicing the photonic integrated circuit die may expose an edge of the one or more optical couplers to form an optical input/output (I/O) facet. In various embodiments, dicing the photonic integrated circuit die may including dicing the one or more optical couplers so that in each of the one or more optical couplers, a new edge surface, i.e. a new optical input/output (I/O) facet, is formed. The newly exposed or newly formed optical input/output (I/O) facet(s) may not be or may be less affected from contamination due to prior processes, e.g. the molding and underfill processes.

The phrase "photonic integrated circuit die" may refer to the original or undiced photonic integrated circuit (PIC) die. The phase "diced photonic integrated circuit (PIC) die" may refer to a remaining portion of the (original or undiced) photonic integrated circuit (PIC) after another portion has been removed. The diced photonic integrated circuit (PIC) die may also be referred to as a remaining portion of the photonic integrated circuit (PIC) die.

In various embodiments, the (original/undiced) photonic integrated circuit (PIC) die may include a first portion (i.e. the remaining portion) including one or more photonic integrated circuits or components, and a second portion (i.e. the other portion), which may have redundant photonic integrated circuits or components, or may be devoid of any photonic integrated circuit or component. In other words, the original PIC die may include a redundant section, i.e. the other portion, to be removed during dicing so that contamination during embedding may be reduced (side protection). Dicing the photonic integrated circuit die may refer to removing the second portion of the (original/undiced) photonic integrated circuit (PIC) die. The diced photonic integrated circuit die may be or may include the first portion of the (original/undiced) photonic integrated circuit (PIC) die.

In various embodiments, the phrase "stop-ring structure" of FIG. 2 may referred to the original or undiced stop-ring structure. The stop-ring structure may also be referred to as a stop-ring or a dam. The stop-ring structure may have a ring shape, i.e. a shape with a continuous loop having an outer surface and an inner surface, the inner surface defining the hollow space.

In various embodiments, the stop-ring structure may have a circular ring shape, with the inner circumferential surface of the stop-ring structure defining the hollow space. In various other embodiments, the stop-ring structure may have a square or rectangular ring shape, with the inner perimeter surface of the stop-ring structure defining the hollow space.

The phrase "diced stop-ring structure" means an incomplete stop-ring structure, i.e. a remaining portion of the stop-ring structure after another portion is removed by dicing. The diced stop-ring structure (which may also be referred to as a diced stop-ring or a remaining portion of the stop-ring structure/stop-ring) may no long have a ring shape, i.e. may no longer be a loop.

In various embodiments, the diced stop-ring structure and the one or more optical couplers may define a space configured to accommodate an end of an optical fiber.

In various embodiments, the suitable material included in the stop-ring structure (or diced stop-ring structure) may be a polymer. In various other embodiments, any other material(s) may be used.

In various embodiments, the molded package may be diced to remove a first end portion and to remove a second end portion opposite the first end portion.

In various embodiments, the method may also include removing the carrier from the molded package before dicing the molded package. The carrier may refer to a carrier wafer.

In various embodiments, the method may additionally include forming interconnects to electrically connect the photonic integrated circuit die to the redistribution layer.

In various embodiments, forming the molded structure may include forming a vertical electrical interconnect, such as a through mold via (TMV) or a through mold interconnect (TMI). Forming the TMV or TMI may allow for three dimensional connection of the PIC die.

In various embodiments, the method may further include arranging one or more electrical integrated circuit (EIC) dies over the redistribution layer. The one or more electrical integrated circuit (EIC) dies may be arranged lateral to the photonic integrated circuit (PIC) die. Forming the molded package also may include forming the mold structure to also at least partially cover the one or more electrical integrated circuit dies. The mold structure may also be referred to as a mold encapsulation.

In various embodiments, the one or more electrical integrated circuit dies may be or may include a serializer/ deserializer (SERDES) die or a pulse amplitude modulation 4 (PAM-4) die. In various other embodiments, the functionality of SERDES may be embedded in application specific integrated circuits (ASIC). An electrical integrated circuit die may also be referred to as electronic integrated circuit die.

In the current context, a "die" may refer to a chip, and "dice" may refer to a plurality of chips.

The method may further include arranging an (additional) electronic die such as a driver or an amplifier over the redistribution layer.

Forming the molded package may also include forming the mold structure to also at least partially cover the (additional) electronic die such as the driver or the amplifier.

Forming the mold structure may include depositing a mold material. The mold material may be epoxy resin.

The method may further include depositing underfill after providing the stop-ring structure over the redistribution layer.

Various embodiments may relate to a photonic integrated circuit package formed by any method described herein.

Figure 3A:
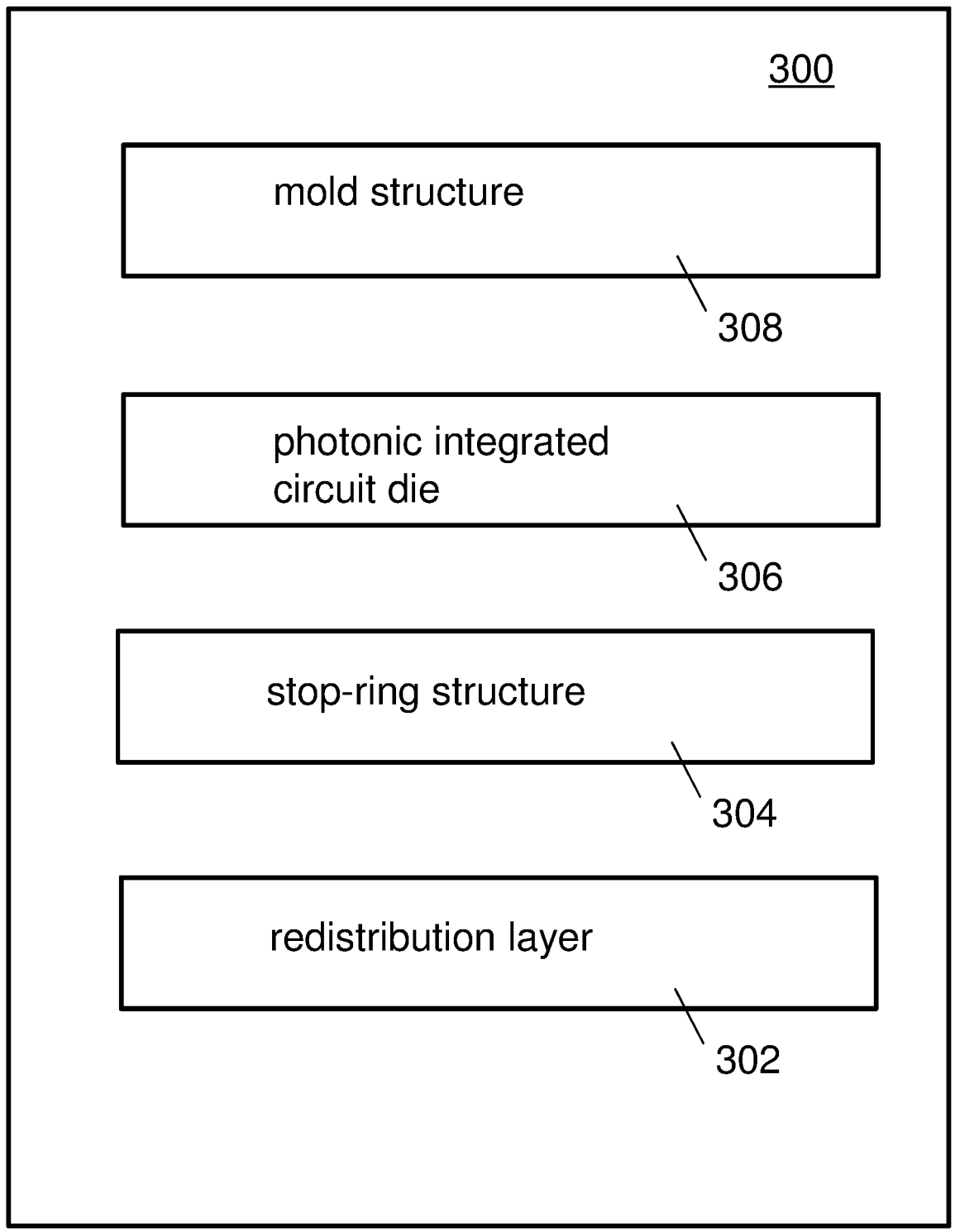
FIG. 3A shows a general illustration of a photonic integrated circuit (PIC) package according to various embodiments.

Various embodiments relate to a photonic integrated circuit package. FIG. 3A shows a general illustration of a photonic integrated circuit (PIC) package 300 according to various embodiments. The photonic integrated circuit package 300 may include a redistribution layer (RDL) 302. The photonic integrated circuit package 300 may also include a stop-ring structure 304 over the redistribution layer 302. The photonic integrated circuit package 300 may further include a photonic integrated circuit die 306 over the redistribution layer 302 so that the photonic integrated circuit die 306 is on the stop-ring structure 304. The photonic integrated circuit package 300 may further include a mold structure 308 at least partially covering the photonic integrated circuit die 306.

In other words, the PIC package 300 may include a redistribution layer 302, a stop-ring structure 304 on or over the redistribution layer 302, a photonic integrated circuit die 306 on the stop-ring structure 304, and a mold structure 308 at least partially covering the photonic integrated circuit die 306.

In various embodiments, the photonic integrated circuit die 306 may be configured for vertical optical coupling. In various other embodiments, the photonic integrated circuit die 306 may be configured for edge optical coupling.

In various embodiments, the photonic integrated circuit (PIC) package 300 may be formed by or after dicing.

In various embodiments, the redistribution layer may be a diced redistribution layer. In various embodiments, the stop-ring structure may be a diced stop-ring structure. In various embodiments, the photonic integrated circuit die may be a diced photonic integrated circuit die. In various embodiments, the mold structure may be a diced mold structure. In the current context, a "diced" component may be a component formed by dicing. A "diced" component may be a remaining portion of the original "undiced" component.

In various embodiments, the photonic integrated circuit die or diced photonic integrated circuit die may include one or more optical couplers. A lateral surface of the diced stop-ring structure or stop-ring structure 302 may be substantially perpendicular to the one or more optical couplers, i.e. the optical facets of the one or more optical couplers. The diced stop-ring structure or stop-ring structure 302 and the one or more optical couplers may define a space configured to accommodate an end of an optical fiber.

In various embodiments, the photonic integrated circuit package 300 may also include a further diced stop-ring structure or a further stop-ring structure over the diced redistribution layer or redistribution layer 302. The diced photonic integrated circuit die or photonic integrated circuit die 306 may also include one or more further optical couplers;

A lateral surface of the further diced stop-ring structure or further stop-ring structure may be substantially perpendicular to the one or more further optical couplers, i.e. the optical facets of the one or more further optical couplers. The further diced stop-ring structure (or stop-ring structure) and the one or more further optical couplers may define a further space configured to hold an end of a further optical fiber.

In various embodiments, the photonic integrated circuit package 300 may further include an electrical integrated circuit (EIC) die over the diced redistribution layer or redistribution layer 302. The electrical integrated circuit die may be electrically coupled to the diced photonic integrated circuit die or photonic integrated circuit die. The diced mold structure or mold structure may also cover the electrical integrated circuit.

In various embodiments, the photonic integrated circuit package 300 may also include a driver over the diced redistribution layer or redistribution layer 302. The electrical integrated circuit die may be electrically coupled to the diced photonic integrated circuit die or photonic integrated circuit die 306 via the driver.

In various embodiments, the photonic integrated circuit package 300 may also include an amplifier over the diced redistribution layer or redistribution layer 302. The electrical integrated circuit die may be electrically coupled to the diced photonic integrated circuit die or photonic integrated circuit die 306 via the amplifier.

In various embodiments, the photonic integrated circuit package 300 may further include a plurality of solder bumps in contact with the diced redistribution layer or redistribution layer 302 so that the diced redistribution layer or redistribution layer 302 is between the diced photonic integrated circuit die or photonic integrated circuit die 306 and the plurality of solder bumps. The solder bumps may be solder balls.

Figure 3B:
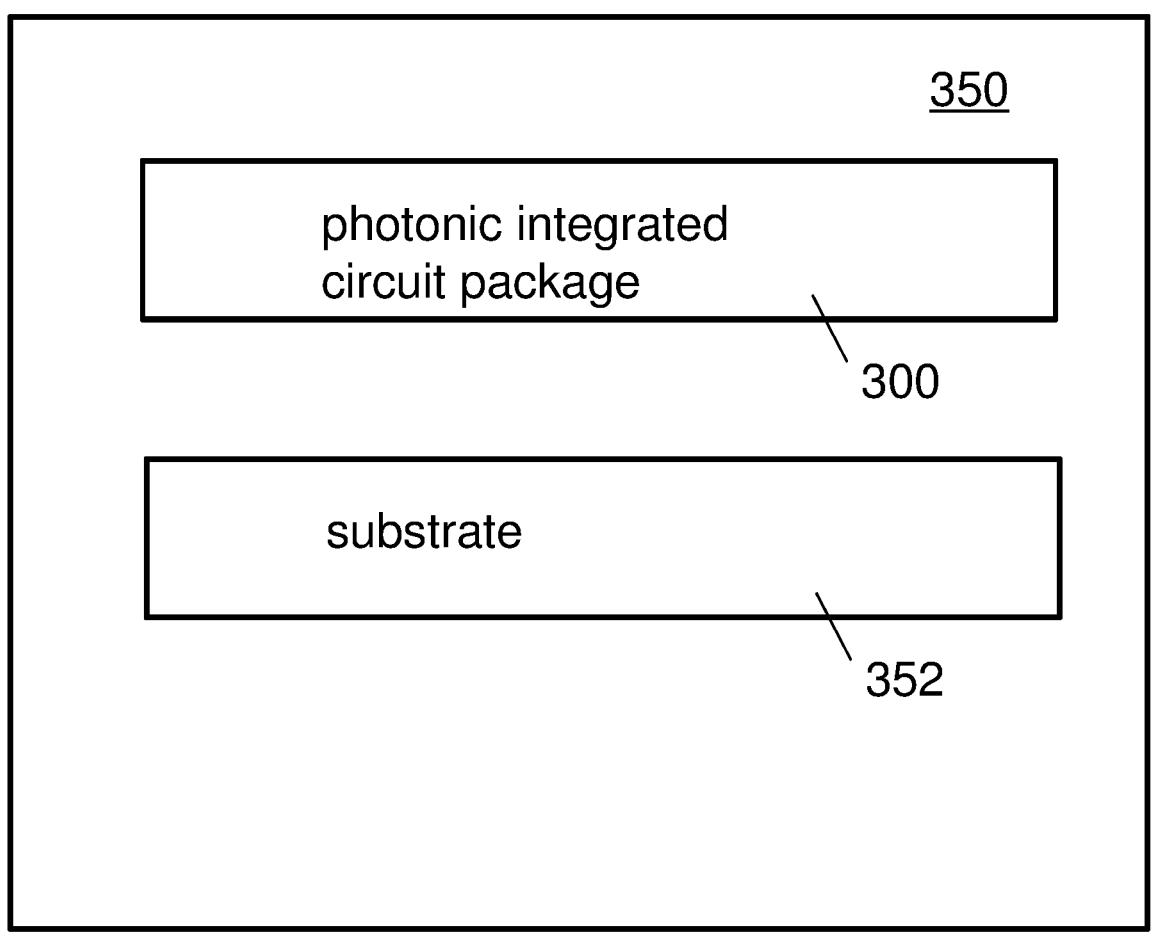
FIG. 3B shows a general illustration of an opto-electronic system according to various embodiments.

Various embodiments may relate to an opto-electronic system. FIG. 3B shows a general illustration of an opto-electronic system 350 according to various embodiments. The opto-electronic system 350 may include a substrate 352. The opto-electronic system 350 may further include the photonic integrated circuit package 300 over the substrate 352.

The opto-electronic system 350 may further include one or more optical fibers coupled to the photonic integrated circuit package 300. The one or more optical fibers may be optically coupled to the photonic integrated circuit package 300, e.g. via optical edge coupling or optical vertical coupling.

In various embodiments, the opto-electronic system 350 may include an external integrated circuit die over the photonic integrated circuit package 300.

In various other embodiments, the opto-electronic system 350 may include an interposer on the substrate 352. The photonic integrated circuit package 300 may be on the interposer. The interposer may include one or more through silicon vias electrically connecting the substrate 352 to the photonic integrated circuit package 300. The opto-electronic system may also include an external integrated circuit die on the substrate 352.

In various embodiments, the opto-electronic system 350 may also include an optical fiber or a plurality of optical fibers. The opto-electronic system 350 may additionally include a fiber support or a fiber block. The fiber support or the fiber block may support or hold the optical fiber or the plurality of optical fibers. The fiber support or the fiber block may be over the substrate 352, over the interposer, and/or over the mold structure.

Various embodiments may relate to forming an opto-electronic system. The method may include forming or arranging the photonic integrated circuit package over a substrate. The method may also include arranging an interposer over the substrate. The method may additionally include coupling an optical fiber or a plurality of optical fibers to the photonic integrated circuit package or the PIC die. The method may also include arranging or forming a fiber support or a fiber block.

The photonic integrated circuit package may be a fanout wafer level package (FOWLP). FIGS. 4A-G illustrate a method of forming a photonic integrated circuit package 400 according to various embodiments. For the sake of clarity and avoid clutter, not all like elements have been labelled.

Figure 4A:
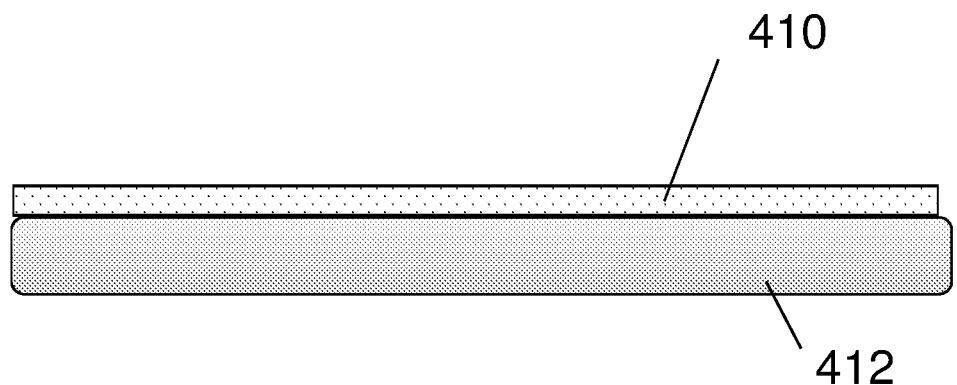
FIG. 4A is a schematic showing a cross-sectional side view of a sacrificial layer being coated onto a carrier according to various embodiments.

FIG. 4A is a schematic showing a cross-sectional side view of a sacrificial layer 410 being coated onto a carrier 412 according to various embodiments. The carrier 412 may be a semiconductor substrate, such a silicon substrate. The carrier 412 may be a wafer assembly. The sacrificial layer 410 may include a dielectric.

Figure 4B:
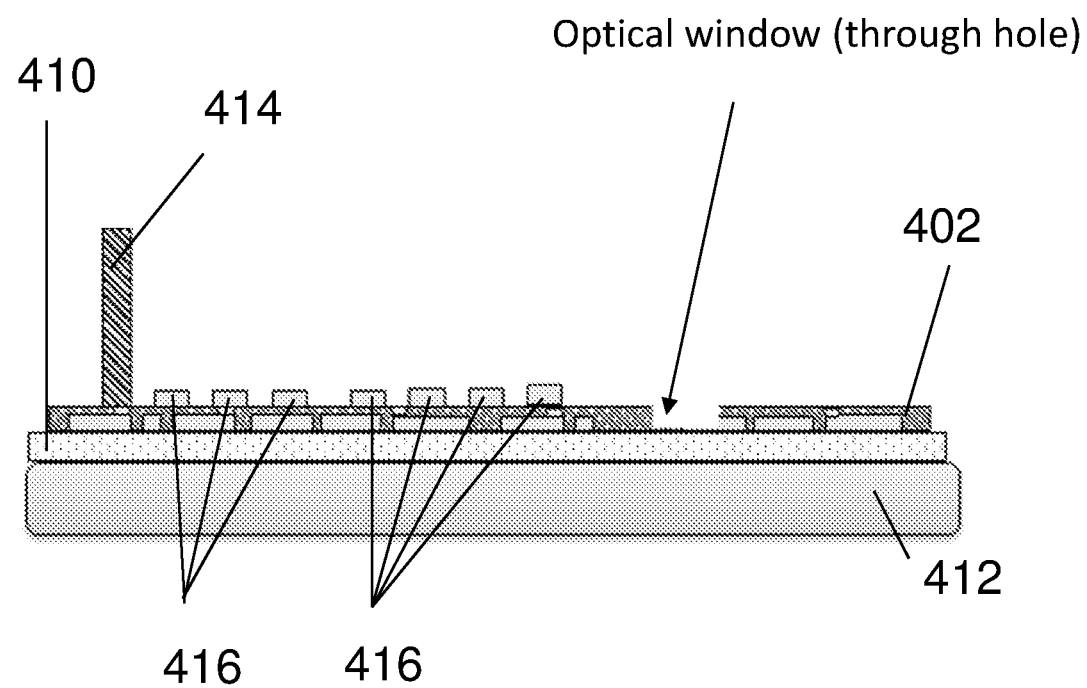
FIG. 4B is a schematic showing a cross-sectional side view of a redistribution layer (RDL) being formed over the carrier according to various embodiments.

FIG. 4B is a schematic showing a cross-sectional side view of a redistribution layer (RDL) 402 being formed over the carrier 412 according to various embodiments.

The redistribution layer 402 may be formed on the sacrificial layer 410. The redistribution layer 402 may include one or more electrically conductive lines, and one or more dielectric layers. An electrically conductive line of the one or more electrically conductive lines may be in contact with a dielectric layer of the one or more dielectric layers. The redistribution layer 402 may also include one or more electrical vias in electrical connection with the one or more electrically conductive lines. For instance, a first electrical conductive line may be electrically connected to a second electrical conductive line via an electrical via. The one or more electrically conductive lines may be embedded in the one or more dielectric layers. A plurality of contact pads 416 may also be formed on a first side of the redistribution layer 402 opposite a second side, which may be in contact with the sacrificial layer 410. The plurality of contact pads 416 may be in electrical connection with the one or more electrically conductive lines of the redistribution layer 402. The redistribution layer 402 may further include one or more bond pads on the second side of the redistribution layer 402. The one or more bond pads may subsequently be used for contacting solder bumps or balls as described in more detail below. In various embodiments, the one or more electrically conductive lines and the one of more vias may electrically connect plurality of contact pads 416 with the one or more bond pads.

The method may additionally include forming an electrically conductive pillar 414, such as a copper (Cu) pillar on the redistribution layer 402. The electrically conductive pillar 414 may be in electrical connection with the one or more electrically conductive lines of the redistribution layer 402, and may be subsequently used to form a through mold via (TMV). In various embodiments, the method may utilize standard RDL processes. In various embodiments, a portion of the redistribution layer 402 may be removed so as to define an optical window, e.g. a through hole or cavity extending from the first side of the redistribution layer 402 to the second side of the redistribution layer 402. The removal of the portion of the redistribution layer 402 may also expose the sacrificial layer 410.

Figure 4C:
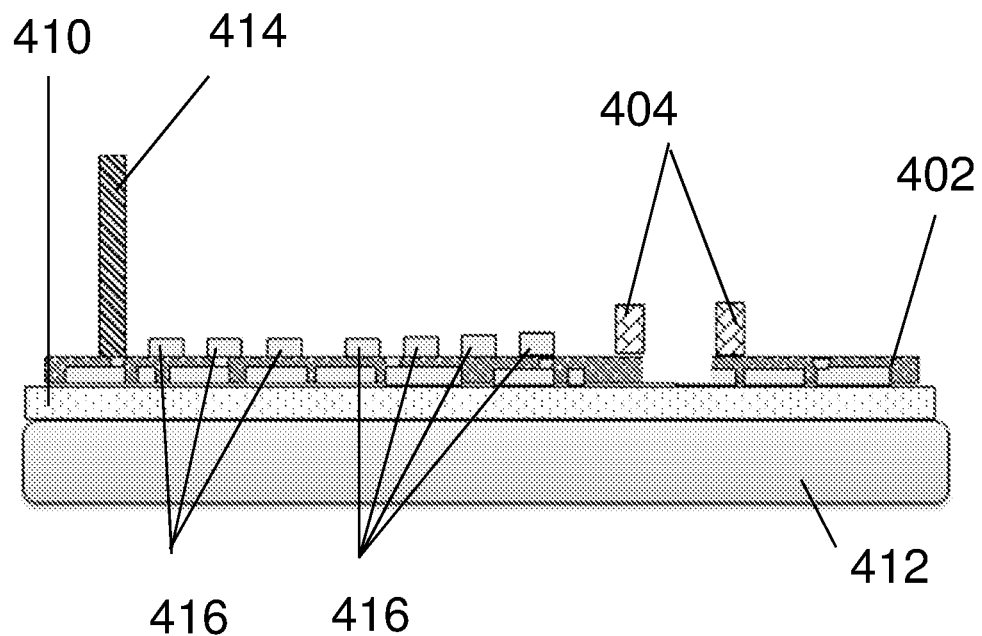
FIG. 4C shows a stop-ring structure being formed, arranged or provided according to various embodiments.

FIG. 4C shows a stop-ring structure 404 being formed, arranged or provided according to various embodiments. The stop-ring structure 404 may be a loop including a polymer or any other suitable material. The stop-ring structure 404 may have an inner wall and an outer wall, with the inner wall defining a hollow space. The stop-ring structure 404 may be provided, arranged, or formed on the redistribution layer 402 such that the hollow space (of the stop-ring structure 404) is aligned with or in fluidic communication with the optical window or through hole (of the redistribution layer 402). As seen from FIG. 4C, the hollow space may be above the optical window or through hole. In various embodiments, the hollow space may have a diameter or lateral dimensions (i.e. length and width) equal to a diameter or lateral dimensions of the optical window or through hole.

Figure 4D:
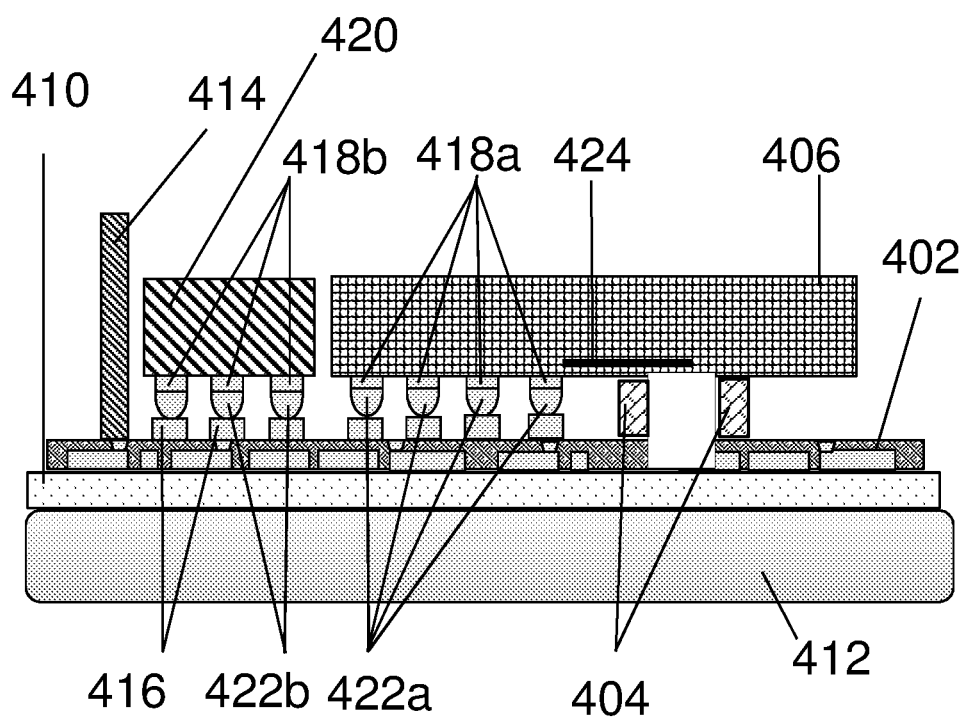
FIG. 4D shows providing or arranging a photonic integrated circuit (PIC) die and an electronic integrated circuit (EIC) die over the redistribution layer according to various embodiments.

FIG. 4D shows providing or arranging a photonic integrated circuit (PIC) die 406 and an electronic integrated circuit (EIC) die 420 over the redistribution layer 402 according to various embodiments. The photonic integrated circuit (PIC) die 406 and the electronic integrated circuit (EIC) die 420 may be flip chip attached.

The photonic integrated circuit (PIC) die 406 (which may also be referred to as a PIC chip) may include a plurality of chip contacts 418a and an optical coupler 424. The plurality of chip contacts 418a and the optical coupler 424 may be provided on one side of the PIC die 406. The electronic integrated circuit (EIC) die may include a plurality of chip contacts 418b.

The photonic integrated circuit (PIC) die 406 may be attached or bonded to the redistribution layer 402 using solder bumps 422a. The solder bumps 422a may bond the plurality of chip contacts 418a to a first group of the plurality of contact pads 416 on the redistribution layer 402. In various embodiments, the optical coupler 424 may be on contact with at least a portion of the stop-ring structure 404. At least a portion of the optical coupler 424 may be directly above the hollow space defined by the stop-ring structure 404.

The electronic integrated circuit (EIC) die 420 may be attached or bonded to the redistribution layer 402 using solder bumps 422b. The solder bumps 422b may bond the plurality of chip contacts 418b to a second group of the plurality of contact pads 416 on the redistribution layer 402. The electronic integrated circuit (EIC) die 420 may be arranged or attached/bonded lateral to the photonic integrated circuit (PIC) die 406.

Figure 4E:
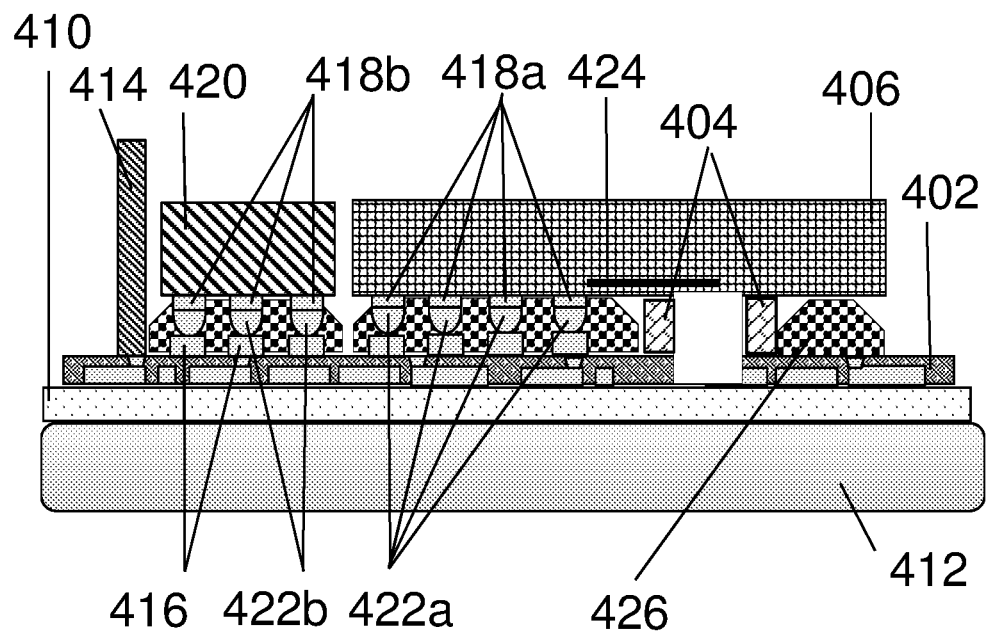
FIG. 4E shows applying underfill material according to various embodiments.

FIG. 4E shows applying underfill material according to various embodiments. The method may include forming an underfill layer 426 by applying a suitable underfill material. The underfill layer 426 may cover or at least partially cover the plurality of contact pads 416 on the redistribution layer 402, the solder bumps 422a, the solder bumps 422b, the chip contacts 418a of the PIC die 402, the chips contacts 418b of the EIC die 420 and/or the stop-ring structure 404.

The stop-ring structure 404 may prevent or reduce the high viscosity underfill material from flowing into or coming into contact with the optical window. The dimension of the optical window may be designed to be bigger so that a slight overflow may not obstruct the optical path.

Figure 4F:
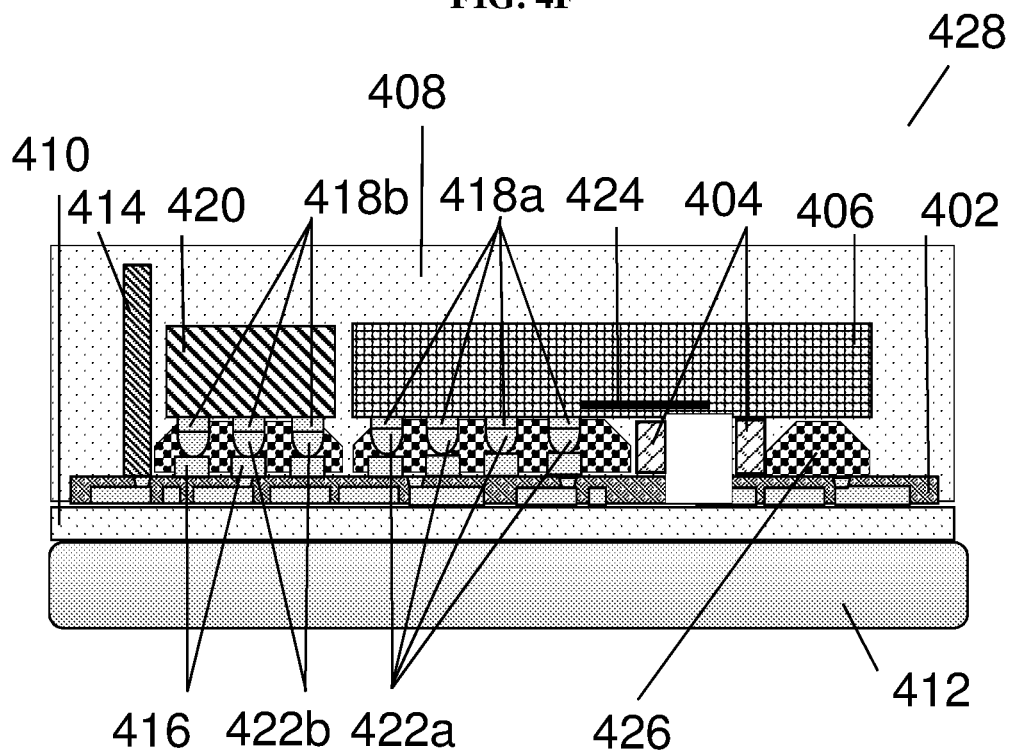
FIG. 4F shows applying a mold material to form a mold structure according to various embodiments.

FIG. 4F shows applying a mold material to form a mold structure 408 according to various embodiments. Applying the mold material to form the mold structure 408 may be referred to as wafer level compression molding. The mold structure 408 may at least partially cover the PIC die 406 to form a molded package 428. The mold structure 408 may also at least cover the EIC die 420, the redistribution layer 402, and the underfill layer 426. The mold structure 408 may also cover the electrically conductive pillar 414. The electrically conductive pillar 414 may form the TMV.

The molded package 428 may include the PIC die 406 (including chip contacts 418a), the EIC die 420 (including chip contacts 418b), the redistribution layer 402, the underfill layer 426, the electrically conductive pillar 414, the plurality of contact pads 416 on the redistribution layer 402, the solder bumps 422a, the solder bumps 422b and the stop-ring structure 404. The molded package 428 may be formed over the carrier 412.

Figure 4G:
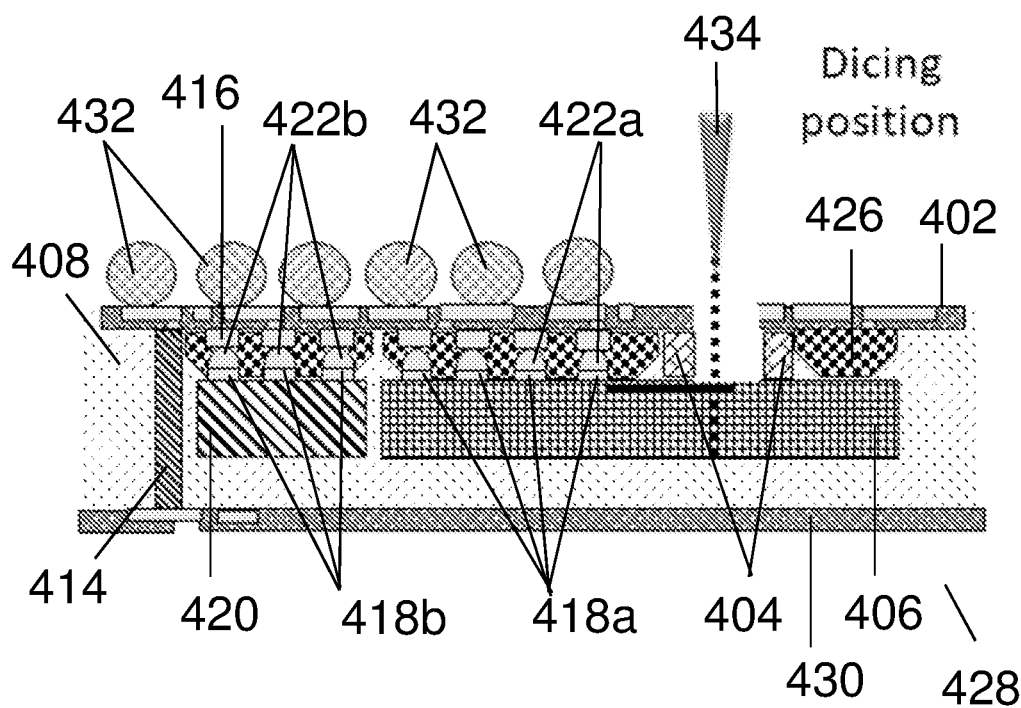
FIG. 4G shows forming a further redistribution layer, solder balls, and dicing of the molded package according to various embodiments.

FIG. 4G shows forming a further redistribution layer 430, solder balls 430, and dicing of the molded package 428 according to various embodiments. The method may further include forming the further redistribution layer 430 on the molded package 428.

The further redistribution layer 430 may include one or more electrically conductive lines, and one or more dielectric layers. An electrically conductive line of the one or more electrically conductive lines may be in contact with a dielectric layer of the one or more dielectric layers. The further redistribution layer 430 may also include one or more electrical vias in electrical connection with the one or more electrically conductive lines. For instance, a first electrical conductive line may be electrically connected to a second electrical conductive line via an electrical via. The one or more electrically conductive lines may be embedded in the one or more dielectric layers.

A portion of the mold structure 408 may be removed, for instance via backgrinding, so that the electrically conductive pillar 414 is exposed, before forming the further redistribution layer 430 on the molded package 428. The further redistribution layer 430 may be formed such that the mold structure 408 is between the redistribution layer 402 and the further redistribution layer 430. A first side of the mold structure 408 may be in contact with the redistribution layer 402, and a second side of the mold structure 408 opposite the first side may be in contact with the further redistribution layer 430. The redistribution layer 402 may be in electrical connection with the further redistribution layer 430 via the electrically conductive pillar 414.

The carrier 412 may also be separated from the molded package 428, for instance via etching of the sacrificial layer 410.

The molded package 428 may be diced using a dicing or cutting tool 434. Dicing the molded package 428 may include dicing the photonic integrated circuit (PIC) die 406 and the stop-ring structure 404. Dicing the molded package 428 may further include dicing the mold structure 408, the redistribution layer 402, and/or the underfill layer 426. The further redistribution layer 430 formed in contact with the molded package 428 may also be diced. The PIC dies 406 may have a buffer area so that removing the buffer area would not affect the operation of the diced PIC die 406. In various embodiments, a portion of the optical coupler 424 may be cut off to form an optical input/output facet for edge coupling. In various other embodiments, for vertical coupling PIC dies, dicing may not be required.

The method may further include forming solder bumps or balls 430 so that a solder bump or ball 430 is formed in contact with each of the one or more bond pads.

Figure 4H:
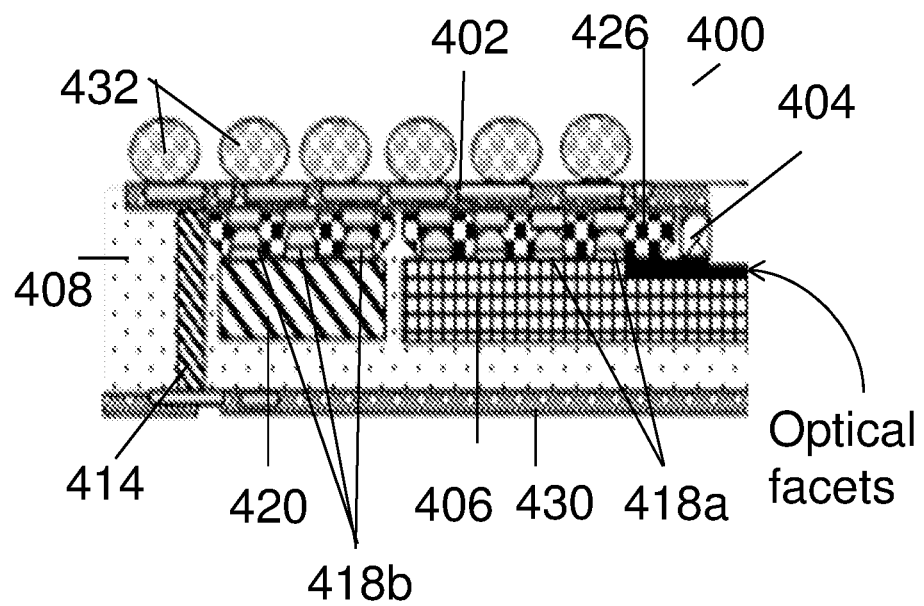
FIG. 4H shows a photonic integrated circuit package according to various embodiments.

FIG. 4H shows a photonic integrated circuit package 400 according to various embodiments. The photonic integrated circuit package 400 may include a diced redistribution layer (RDL) 402. The photonic integrated circuit package 400 may also include a diced stop-ring structure 404 in contact with the diced redistribution layer 402. The photonic integrated circuit package 400 may further include a diced photonic integrated circuit die 406 in contact with the diced stop-ring structure 404. The photonic integrated circuit package 400 may further include a diced mold structure 408 at least partially covering the diced photonic integrated circuit die 406. The diced photonic integrated circuit die 406 may include a diced optical coupler 424 with a newly formed optical I/O facet for optical edge coupling.

Figure 5A:
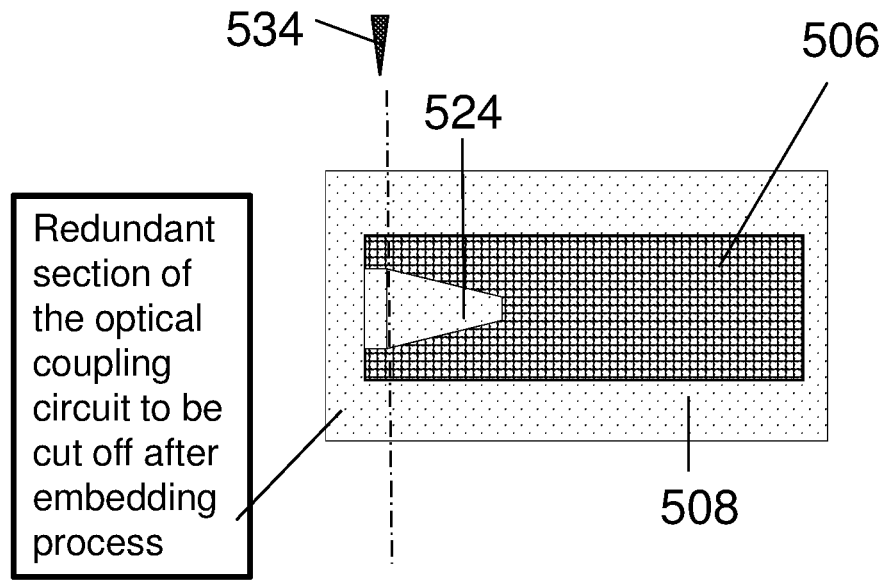
FIG. 5A is a top view showing a photonic integrated circuit die with an optical coupler being diced using a dicing tool according to various embodiments.
Figure 5B:
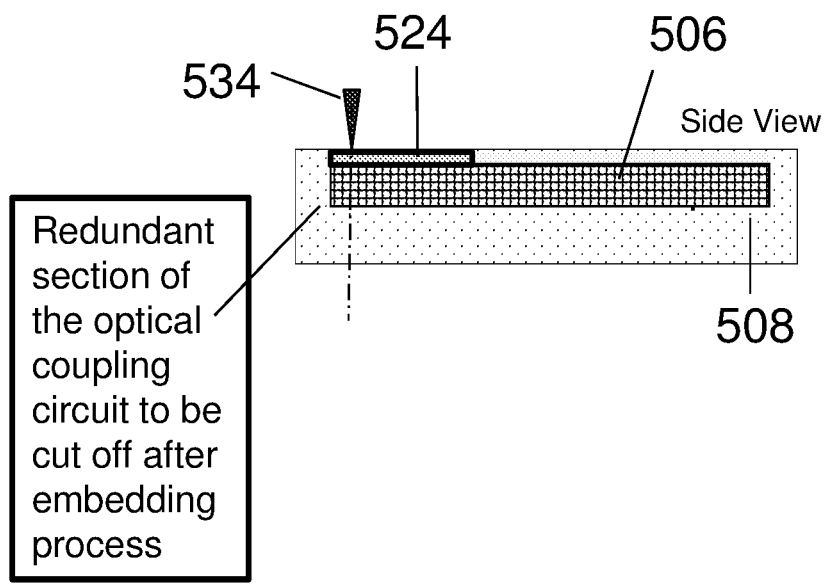
FIG. 5B is a side view showing the photonic integrated circuit die of FIG. 5A being diced using the dicing tool according to various embodiments.

FIG. 5A is a top view showing a photonic integrated circuit die 506 with an optical coupler 524 being diced using a dicing tool 534 according to various embodiments. The photonic integrated circuit die 506 may be covered by a mold structure 508. FIG. 5B is a side view showing the photonic integrated circuit die 506 of FIG. 5A being diced using the dicing tool 534 according to various embodiments. The optical coupler 524 may also be referred to as an optical coupling circuit. The optical coupler 524 may be a tapered waveguide. As shown in FIGS. 5A, 5B, a redundant section of the tapered waveguide 524, i.e. a straight section of the waveguide 524, may be cut off.

Figure 5C:
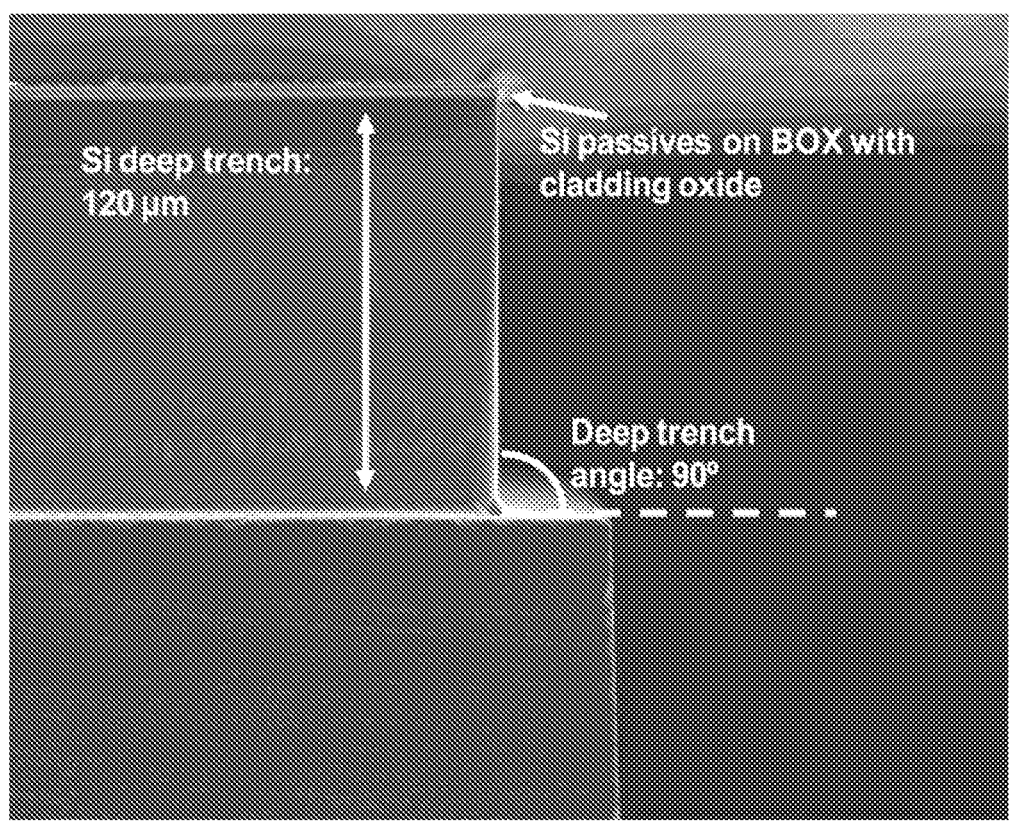
FIG. 5C is a scanning electron microscopy (SEM) image of a 120 μm silicon deep trench formed in the photonic integrated circuit die (PIC) optical input/output edge according to various embodiments.

The key challenge of molding the PIC is to reduce or prevent contamination on the photonic I/O facets. For the PIC, an oxide etch is first applied on the I/O to create a smooth oxide facet to minimize the light scattering at the sidewall. This may then be followed by etching of a deep trench of ~120 μm for the fiber clearance. FIG. 5C is a scanning electron microscopy (SEM) image of a 120 μm silicon deep trench formed in the photonic integrated circuit die (PIC) optical input/output edge according to various embodiments. The PIC may be singulated or diced at a distance from the deep trench so that a buffer area is formed. The buffer area is part of protection for the photonic I/O facet during the subsequence molding process.

Figure 6A:
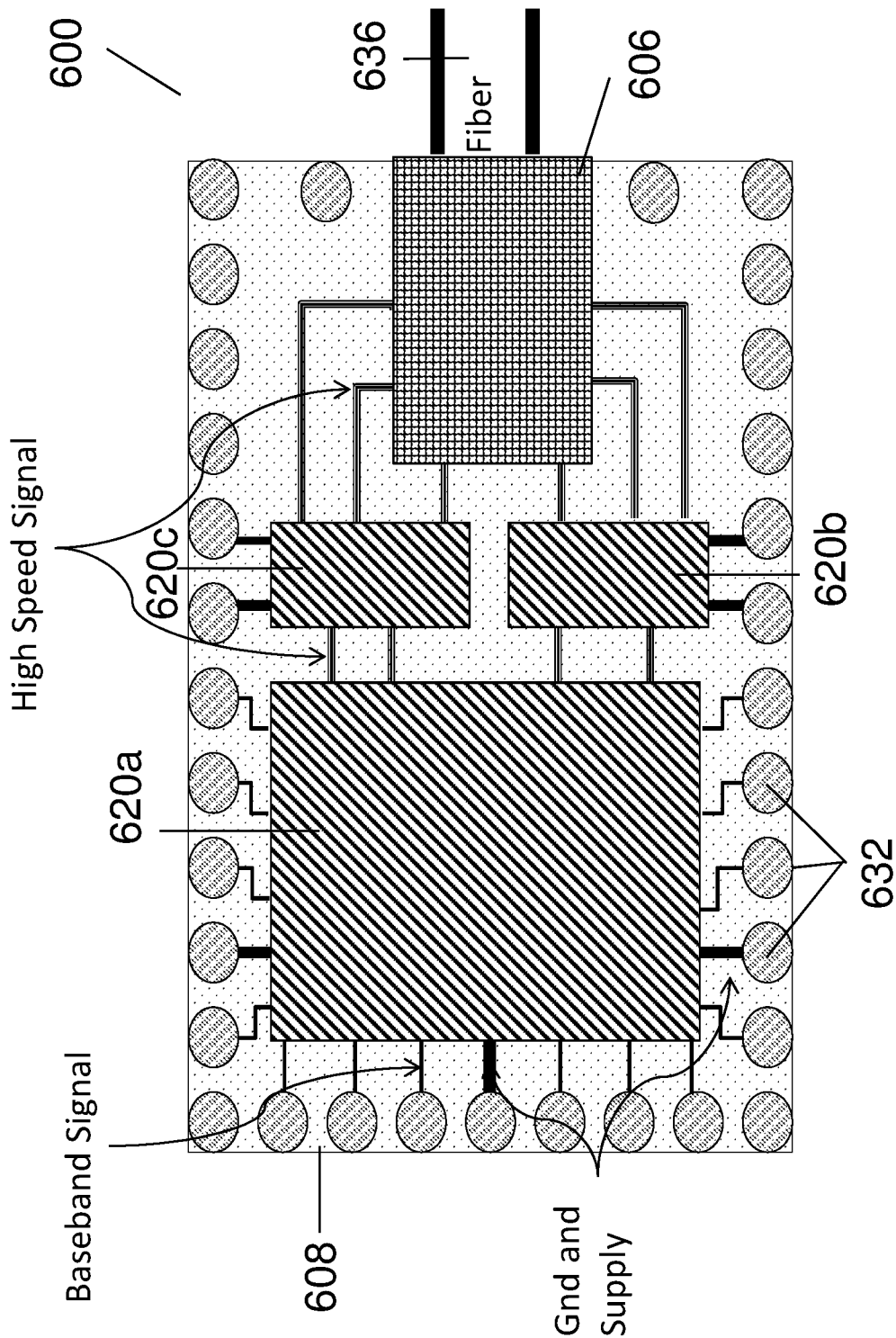
FIG. 6A is a schematic showing a top planar view of a photonic integrated circuit package being coupled to an optical fiber according to various embodiments.
Figure 6B:
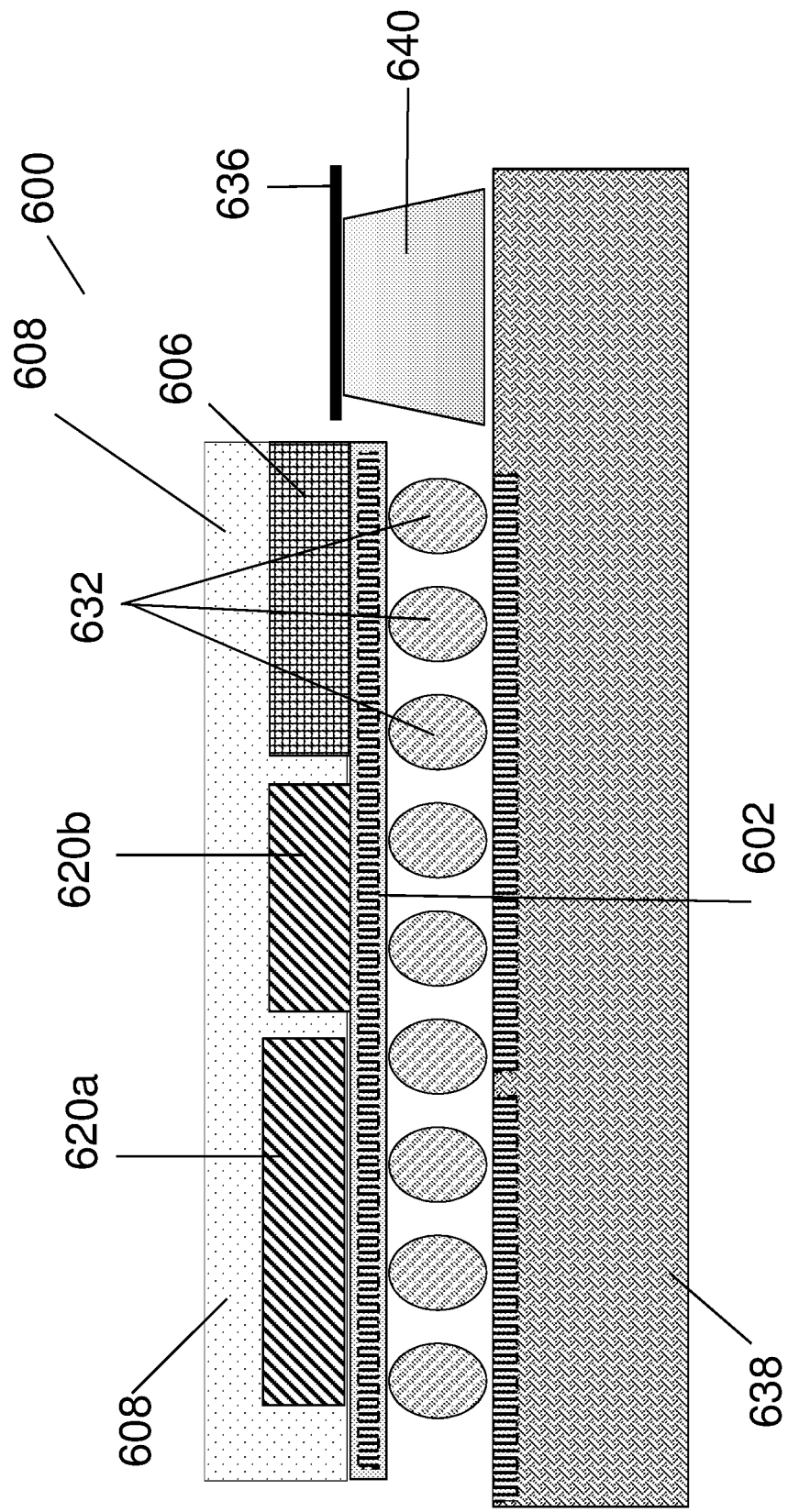
FIG. 6B is a schematic showing a side view of the photonic integrated circuit package of FIG. 6A being coupled to the optical fiber according to various embodiments.

FIG. 6A is a schematic showing a top planar view of a photonic integrated circuit package 600 being coupled to an optical fiber 636 according to various embodiments. FIG. 6B is a schematic showing a side view of the photonic integrated circuit package 600 of FIG. 6A being coupled to the optical fiber 636 according to various embodiments. For the sake of clarity and avoid clutter, not all like elements have been labelled.

The photonic integrated circuit package 600 may include a photonic integrated circuit (PIC) die 606, and three electrical integrated circuit (EIC) dies: a serializer/deserializer (SERDES) die 620a (or pulse modulation 4 (PAM-4) die, e.g. ~10 mm×10 mm), a trans-impedance amplifier (TIA) die 620b (e.g. ~2 mm×3.5 mm), and a driver die 620c (e.g. ~14 mm×9.1 mm). Dice 620b, 620c may be electrically connected to PIC die 606, and die 620a may be connected to dice 620b, 620c. The output of the high speed SERDES die 620a may be transmitted to the diver die 620c, and the output from the TIA die 620b may be transmitted to the SERDES die 620a.

The dice 620a-c may be electrically connected to solder bumps or balls 632, e.g. C4 solder bumps. Dice 620a-c, 606 may be at least be partially covered by a diced mold structure 608. Dice 620a-c, 606 may be over a redistribution layer 602. For the sake of simplicity, some features, such as a diced stop-ring structure, are not indicated in FIGS. 6A-B. The photonic integrated circuit package 600 may be coupled to a substrate 638, which may be a printed circuit board (PCB) using the solder bumps or balls 632. The substrate 638 may include one or more electrical interconnects.

The interconnects coupling dice 606, 620a-c may be designed within package 600 to leverage on the redistribution layer 602. The baseband signals of the SERDES die 620a may be then routed to input/outputs (I/O) of the substrate 638, i.e. the one or more electrical interconnects of the substrate 638. The I/Os may include supply and ground terminals. In this way, only the baseband signal may be routed to the substrate 638 via the solder bumps or balls 632.

An optical fiber 636 may be optically coupled to the PIC die 606, i.e. to the optical coupler of the PIC die 606 via edge coupling. The optical fiber 636 may be arranged laterally to the photonic integrated circuit package 600, and may be supported using a fiber support 640, such as a precision support. The fiber support 640 may be on the substrate 638.

The optical I/Os may be designed only one side of the chip so as to simplify the edge fiber coupling circuit design. As seen from FIG. 6A, only one side of the package 600 may be used for optical coupling, while the remaining three sides may be designed with electrical I/Os.

In various embodiments, more than one optical fiber may be optically coupled to the PIC die, and a fiber array including a plurality of optical fibers may be optically coupled to the PIC die. For simplicity, the diced optical coupler or optical coupler may not be shown in FIGS. 6A-B.

FIG. 7 is a schematic showing a top planar view of a photonic integrated circuit package 700 according to various embodiments. For the sake of clarity and avoid clutter, not all like elements have been labelled. The photonic integrated circuit package 700, i.e. an EPIC FOWLP, may be designed with 2 sides for optical edge coupling. Optical edge coupling I/Os may be formed on opposing sides of the package 700. The package 700 may include a PIC die 706 for coupling to optical fibers 736a, 736b. The package 700 may also include TIA die 720a and driver die 720b in electrical connection with the PIC die 706. The package 700 may further include a mold structure 708 at least partially covering the PIC die 706 and dies 720a, 720b. In addition, solder bumps or balls 732 may also be formed on the mold structure 708. In various embodiments, the molded package may be diced to remove a first end portion and to remove a second end portion opposite the first end portion to form the 2-sided edge coupled design.

The 2-sided edge coupled design may have a lower optical loss as the optical signal may have more routing freedom. However, an additional set of optical coupling circuit may be required. For simplicity, the diced optical coupler or optical coupler may not be shown in FIG. 7.

Figure 8:
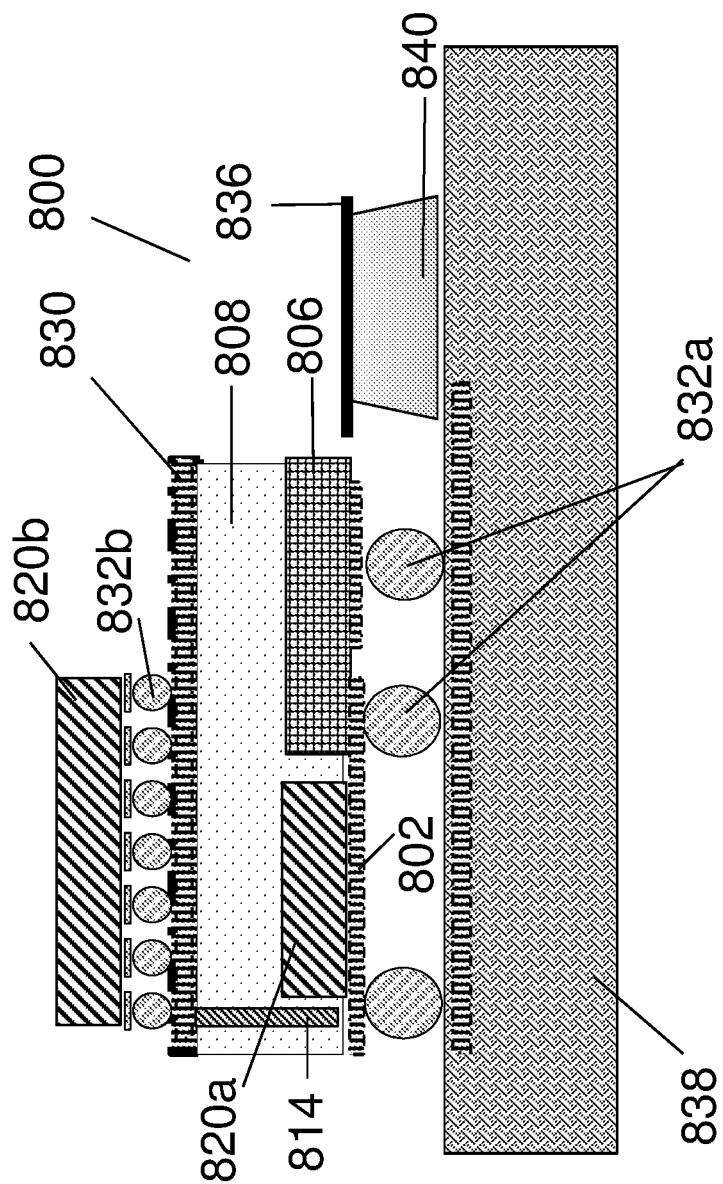
FIG. 8 is a schematic showing a cross-sectional side view of an opto-electronic system according to various embodiments.

FIG. 8 is a schematic showing a cross-sectional side view of an opto-electronic system according to various embodiments. For the sake of clarity and avoid clutter, not all like elements have been labelled. The opto-electronic system may include a package-on-package (POP) design. The system may include a photonic integrated circuit (PIC) package 800 attached to a substrate 838, e.g. a PCB, via solder bumps 832a. The package 800 may include a redistribution layer (RDL) 802, a PIC die 806 over the redistribution layer (RDL) 802, an EIC die 820a, such as a TIA die or a driver die, over the RDL 802 and lateral to the PIC die 806, a mold structure 808, and a further redistribution layer (RDL) 830 on the mold structure 808. A further EIC die 820b may be attached to the further RDL 830 via solder bumps 832b.

The package 800 may also include a Through Mold Via/Through Mold Interconnect/Through Copper Pillar (TMV/TMI/TCP) 814 for the electrical routing. The TMV/TMI/TCP 814 may electrically connect the RDL 802 and the further RDL 830. As such, the further EIC die 820b may be electrically connected to the substrate 838 (i.e. one or more electrical interconnects of the substrate 838) via solder bumps 832a, 832b, redistribution layers (RDLs) 802, 830 and TMV/TMI/TCP 814. The TMV/TMI/TCP 814 may allow for 3D connection of the PIC package 800. By using TMV/TMI/TCP 814, the PIC die 806 may not require a through silicon via (TSV). An optical fiber 836 may be mounted on the substrate 838 via support 840, and optically coupled to PIC die 806. For simplicity, the diced optical coupler or optical coupler may not be shown in FIG. 8.

Figure 9:
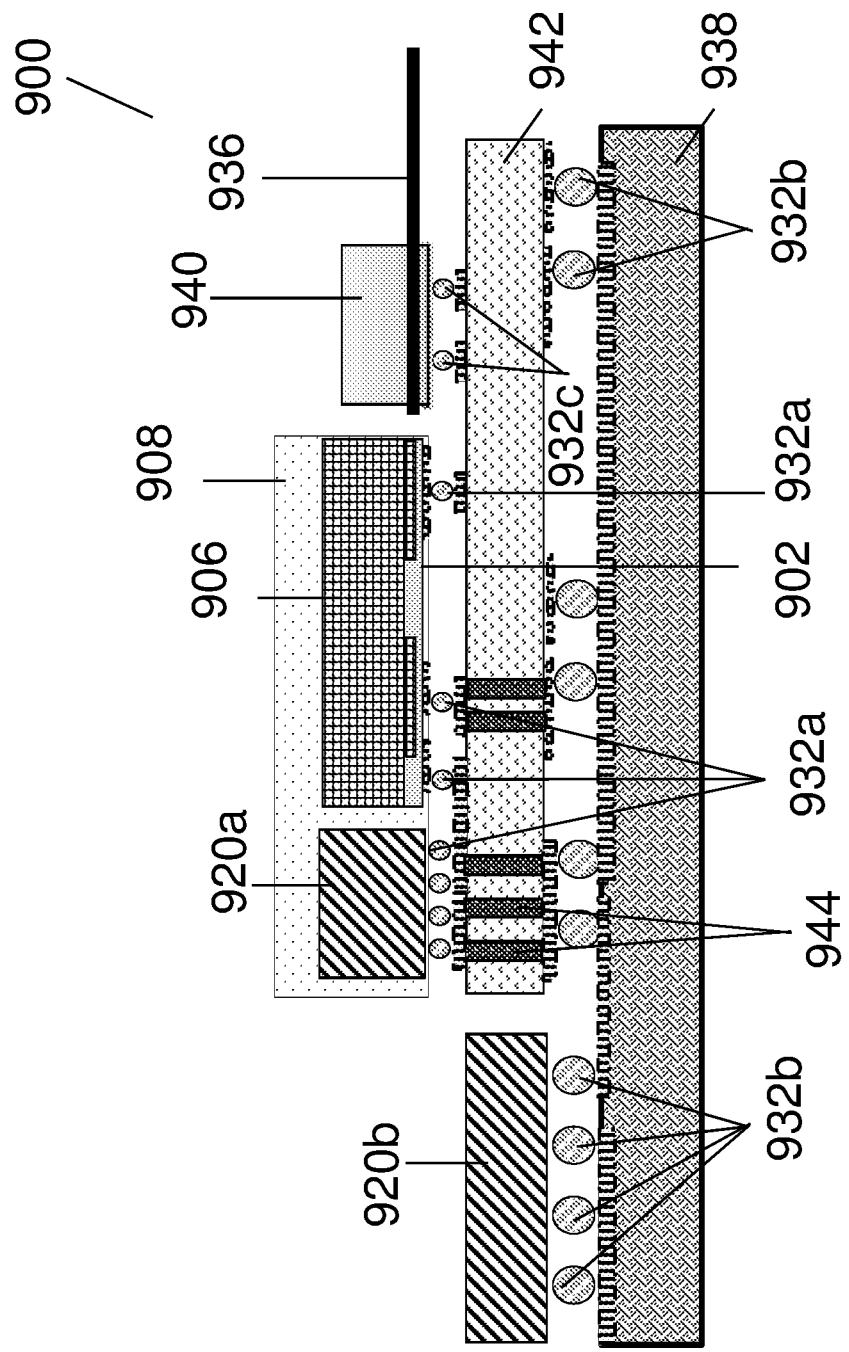
FIG. 9 is a schematic showing a cross-sectional side view of an opto-electronic system according to various embodiments.

FIG. 9 is a schematic showing a cross-sectional side view of an opto-electronic system according to various embodiments. For the sake of clarity and avoid clutter, not all like elements have been labelled. In various embodiments, the opto-electronic system may include a photonic integrated circuit package 900 integrated with an interposer 942, such as a silicon (Si) interposer. The photonic integrated circuit package 900 may include a photonic integrated circuit die 906, a redistribution layer 902, an electrical integrated circuit die 920a, and a mold structure 909 covering or in contact with the photonic integrated circuit die 906, the redistribution layer 902, and the electrical integrated circuit die 920a. For simplicity, the diced optical coupler or optical coupler may not be shown in FIG. 9.

The photonic integrated circuit package 900 may be mounted on the interposer 942 using solder bumps 932a. The interposer 942 may include one or more first electrical contacts on a first side of the interposer, and one or more second electrical contacts on a second side of the interposer opposite the first. The interposer 942 may further include one or more through silicon vias (TSVs) 944 extending from the first side of the interposer 942 to the second side of the interposer 942, each via electrically connecting a first electrical contact and a second electrical contact. The opto-electronic system may also include a serializer/deserializer (SERDES) die 920b arranged lateral to the interposer 942. The SERDES die 920b and the interposer 942 may be mounted on the substrate 938 using solder bumps 932b. The substrate 938 may be a printed circuit board (PCB). The substrate 938 may include one or more interconnect lines. The one or more interconnects lines of the substrate may be in electrical connection with the PIC die 906 and the EIC die 920a via the TSVs 944 and the solder bumps 932a-b, and/or may be in electrical connection with the SERDES die 920b via the solder bumps 932b.

The system may also include an optical fiber 936 optically coupled to the PIC die 906 via optical edge coupling. The optical fiber 936 may be held by support or fiber block 940, which may be mounted on the substrate 938 using solder bumps 932c. The optical fiber 936 may be aligned to the PIC die 906, i.e. the optical coupler of the PIC die 906 using various alignment techniques.

In various embodiments, alignment grooves, such as U-shaped or V-shaped grooves may be formed on the PIC die 906. Dummy optical fibers may be arranged into the grooves so a first portion of each dummy optical fiber is within a groove, a second portion which protrudes out is received by a matching groove on the interposer 942, and a third portion between the first portion and the second portion determines the vertical offset between the PIC die 906 and the interposer 942. Accordingly, the lateral dimensions of the grooves and dummy optical fibers, which are related to the respective dimensions, and which may be more precisely controlled, can be used to provide a certain vertical offset between the PIC die and the underlying interposer 942.

The grooves on the PIC die 906 may be protected together or separately with the PIC optical input/output using with the stop-ring, thus preventing or reducing the underfill from flowing into the grooves. With these precise grooves, the PIC die 906 may be assembled together with the fiber support 940 onto the surface of the interposer 942, which may be fabricated with the matching U-shaped or V-grooves.

FIGS. 10A-F illustrate a method of forming a photonic integrated circuit package 1000 according to various embodiments. For the sake of clarity and avoid clutter, not all like elements have been labelled.

Figure 10A:
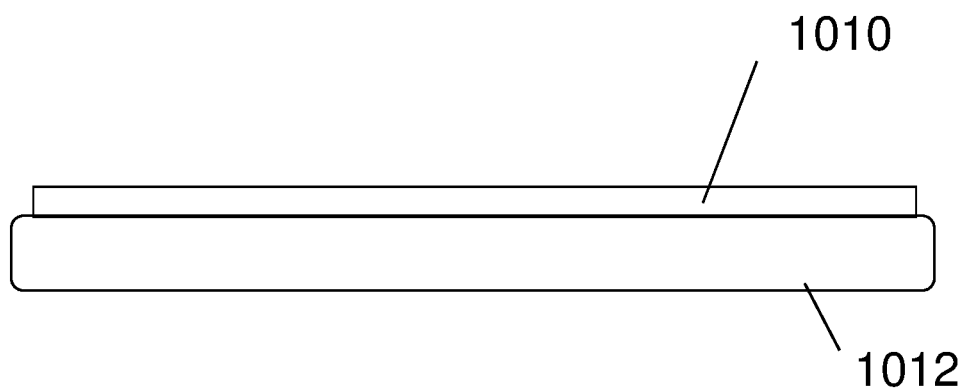
FIG. 10A is a schematic showing a cross-sectional side view of a sacrificial layer being coated onto a carrier according to various embodiments.

FIG. 10A is a schematic showing a cross-sectional side view of a sacrificial layer 1010 being coated onto a carrier 1012 according to various embodiments. The carrier 1012 may be a semiconductor substrate, such a silicon substrate. The carrier 1012 may be a wafer assembly.

Figure 10B:
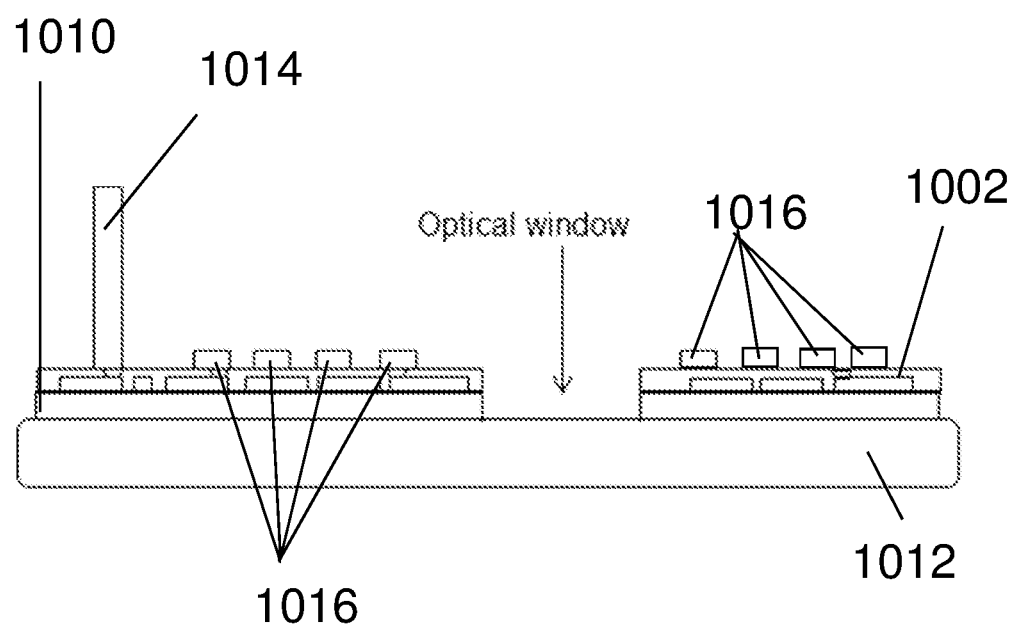
FIG. 10B is a schematic showing a cross-sectional side view of a redistribution layer (RDL) being formed over the carrier according to various embodiments.

FIG. 10B is a schematic showing a cross-sectional side view of a redistribution layer (RDL) 1002 being formed over the carrier 1012 according to various embodiments.

The redistribution layer 1002 may be formed on the sacrificial layer 1010. The redistribution layer 1002 may include one or more electrically conductive lines, and one or more dielectric layers. An electrically conductive line of the one or more electrically conductive lines may be in contact with a dielectric layer of the one or more dielectric layers. The redistribution layer 1002 may also include one or more electrical vias in electrical connection with the one or more electrically conductive lines. For instance, a first electrical conductive line may be electrically connected to a second electrical conductive line via an electrical via. The one or more electrically conductive lines may be embedded in the one or more dielectric layers. A plurality of contact pads 1016 may also be formed on a first side of the redistribution layer 1002 opposite a second side, which may be in contact with the sacrificial layer 1010. The plurality of contact pads 1016 may be in electrical connection with the one or more electrically conductive lines of the redistribution layer 1002. The redistribution layer 1002 may further include one or more bond pads on the second side of the redistribution layer 1002. The one or more bond pads may subsequently be used for contacting solder bumps or balls. In various embodiments, one or more electrically conductive lines and the one of more vias may electrically connect plurality of contact pads 1016 with the one or more bond pads.

The method may additionally include forming an electrically conductive pillar 1014, such as a copper (Cu) pillar on the redistribution layer 1002. The electrically conductive pillar 1014 may be in electrical connection with the one or more electrically conductive lines of the redistribution layer 1002, and may be subsequently used to form a through mold via (TMV). In various embodiments, a portion of the redistribution layer 1002 may be removed so as to define an optical window, e.g. a through hole or cavity extending from the first side of the redistribution layer 1002 to the second side of the redistribution layer 1002. The removal of the portion of the redistribution layer 902 may also expose the sacrificial layer 1010.

Figure 10C:
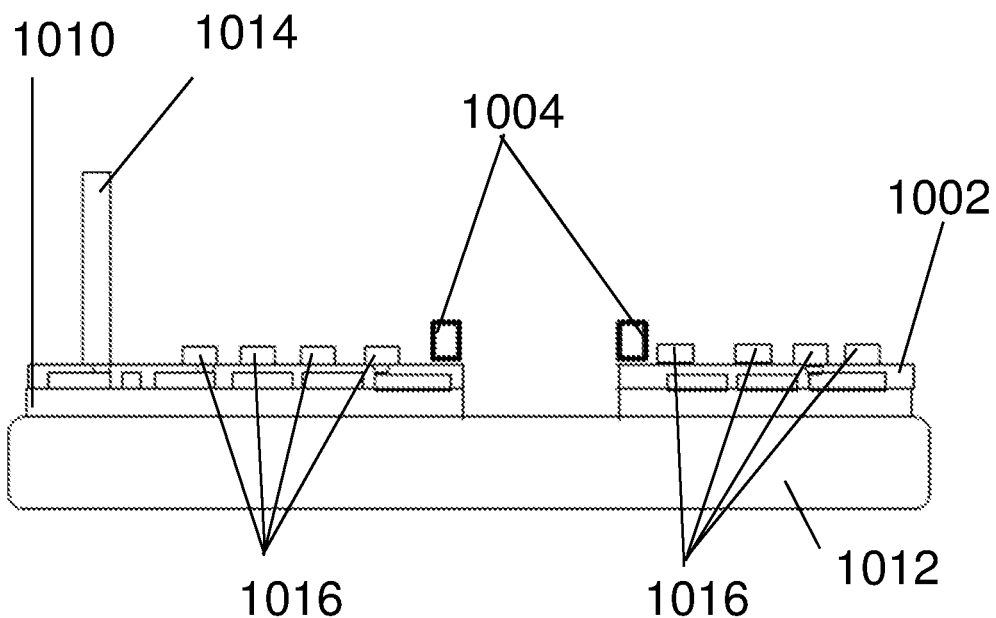
FIG. 10C shows a stop-ring structure being formed, arranged, or provided according to various embodiments.

FIG. 10C shows a stop-ring structure 1004 being formed, arranged or provided according to various embodiments. The stop-ring structure 1004 may have an inner wall and an outer wall, with the inner wall defining a hollow space. The stop-ring structure 1004 may be provided, arranged, or formed on the redistribution layer 1002 such that the hollow space (of the stop-ring structure 1004) is aligned with or in fluidic communication with the optical window or through hole (of the redistribution layer 1002). As seen from FIG. 10C, the hollow space may be above the optical window or through hole. In various embodiments, the hollow space may have a diameter or lateral dimensions (i.e. length and width) equal to a diameter or lateral dimensions of the optical window or through hole.

Figure 10D:
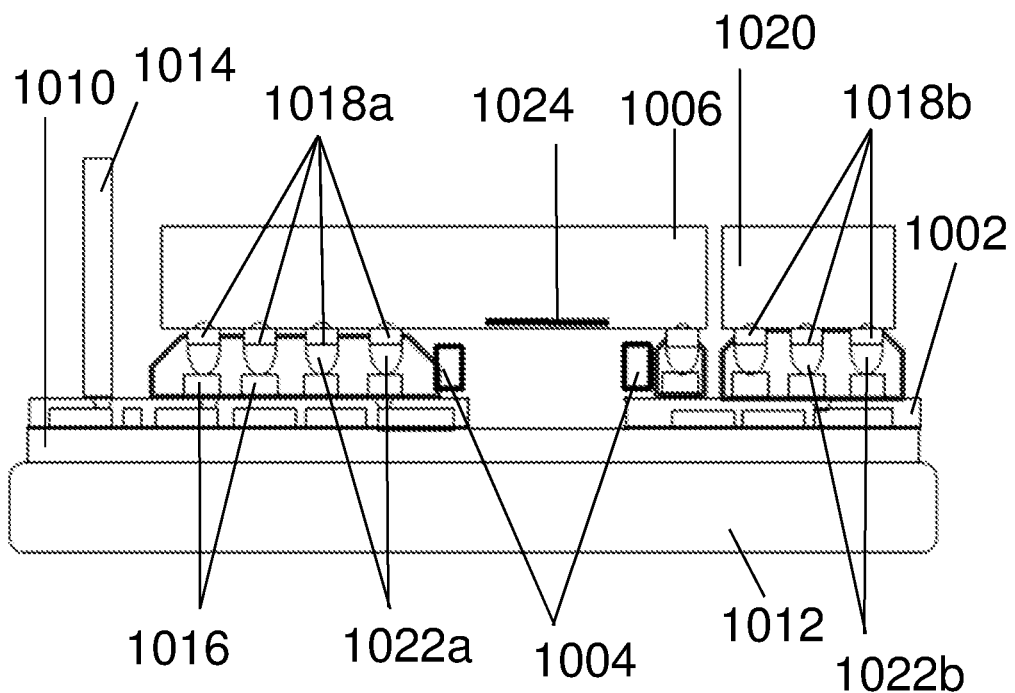
FIG. 10D shows providing or arranging a photonic integrated circuit (PIC) die and an electronic integrated circuit (EIC) die over the redistribution layer according to various embodiments.

FIG. 10D shows providing or arranging a photonic integrated circuit (PIC) die 1006 and an electronic integrated circuit (EIC) die 1020 over the redistribution layer 1002 according to various embodiments. The photonic integrated circuit (PIC) die 1006 and the electronic integrated circuit (EIC) die 1020 may be flip chip attached.

The photonic integrated circuit (PIC) die 1006 (which may also be referred to as a PIC chip) may include a plurality of chip contacts 1018a and an optical coupler 1024. The plurality of chip contacts 1018a and the optical coupler 1024 may be provided on one side of the PIC die 1006. The electronic integrated circuit (EIC) die 1020 may include a plurality of chip contacts 1018b.

The photonic integrated circuit (PIC) die 1006 may be attached or bonded to the redistribution layer 1002 using solder bumps 1022a. The solder bumps 1022a may bond the plurality of chip contacts 1018a to a first group of the plurality of contact pads 1016 on the redistribution layer 1002. The stop-ring structure 1004 maybe in contact with the photonic integrated circuit (PIC) die 1006. In various embodiments, at least a portion of the optical coupler 1024 may be directly above the hollow space defined by the stop-ring structure 1004.

The electronic integrated circuit (EIC) die 1020 may be attached or bonded to the redistribution layer 1002 using solder bumps 1022b. The solder bumps 1022b may bond the plurality of chip contacts 1018b to a second group of the plurality of contact pads 1016 on the redistribution layer 1002. The electronic integrated circuit (EIC) die 1020 may be arranged or attached/bonded lateral to the photonic integrated circuit (PIC) die 1006.

The method may include forming an underfill layer 1026 by applying a suitable underfill material. The underfill layer 1026 may cover or at least partially cover the plurality of contact pads 1016 on the redistribution layer 1002, the solder bumps 1022a, the solder bumps 1022b, the chip contacts 1018a of the PIC die 1002, the chips contacts 1018b of the EIC die 1020 and/or the stop-ring structure 1004.

The stop-ring structure 1004 may prevent or reduce the high viscosity underfill material from flowing into or coming into contact with the optical window.

Figure 10E:
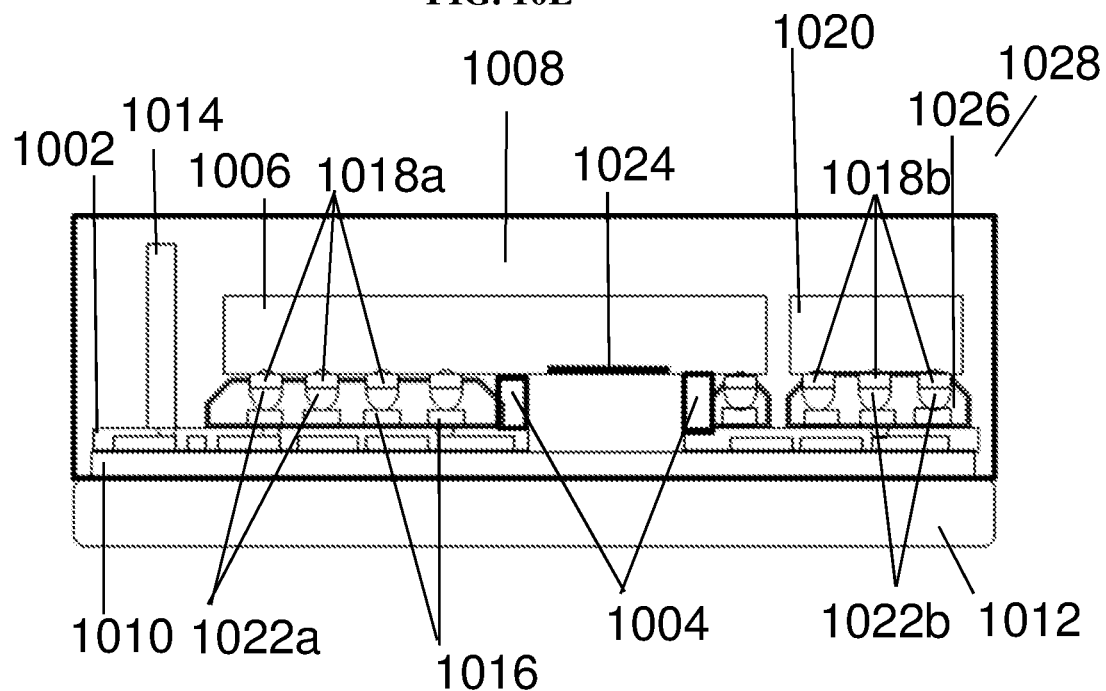
FIG. 10E shows applying a mold material to form a mold structure according to various embodiments.

FIG. 10E shows applying a mold material to form a mold structure 1008 according to various embodiments. Applying the mold material to form the mold structure 1008 may be referred to as wafer level compression molding. The mold structure 1008 may at least partially cover the PIC die 1006 to form a molded package 1028. The mold structure 1008 may also at least cover the EIC die 1020, the redistribution layer 1002, and the underfill layer 1026. The mold structure 1008 may also cover the electrically conductive pillar 1014. The electrically conductive pillar 1014 may form the TMV.

The molded package 1028 may include the PIC die 1006 (including chip contacts 1018a), the EIC die 1020 (including chip contacts 1018b), the redistribution layer 1002, the underfill layer 1026, the electrically conductive pillar 1014, the plurality of contact pads 1016 on the redistribution layer 1002, the solder bumps 1022a, the solder bumps 1022b and the stop-ring structure 1004. The molded package 1028 may be formed over the carrier 1012.

Figure 10F:
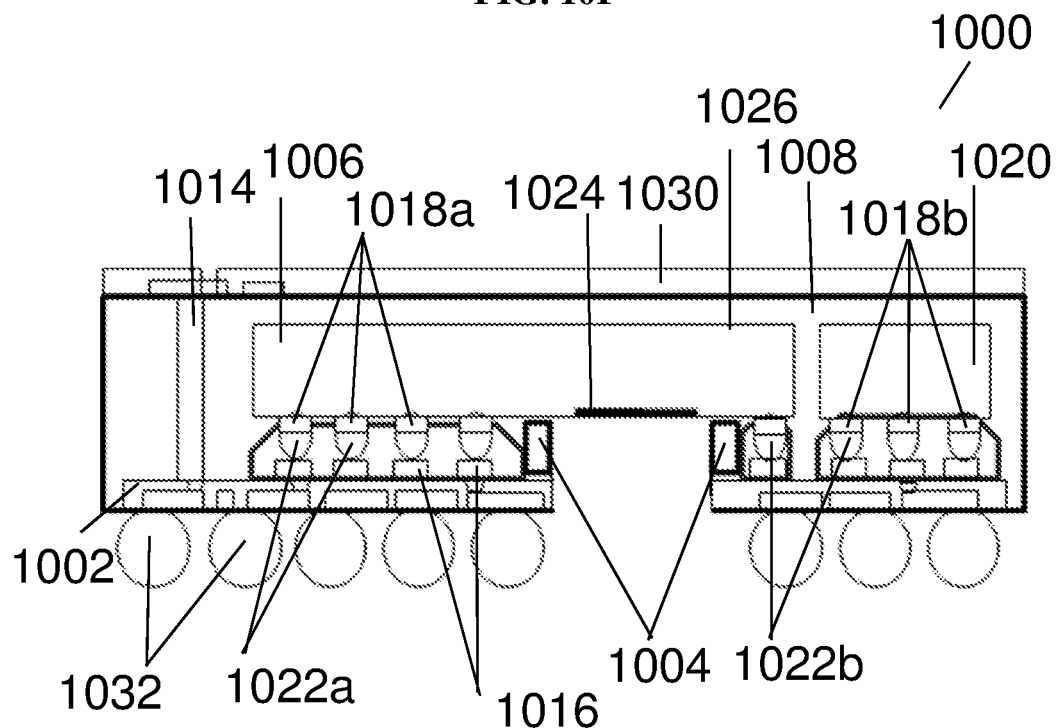
FIG. 10F shows forming a further redistribution layer and solder balls to form a photonic integrated circuit package according to various embodiments.

FIG. 10F shows forming a further redistribution layer 1030 and solder balls 1030 to form a photonic integrated circuit package 1000 according to various embodiments.

The method may further include forming the further redistribution layer 1030 on the molded package 1028.

The further redistribution layer 1030 may include one or more electrically conductive lines, and one or more dielectric layers. An electrically conductive line of the one or more electrically conductive lines may be in contact with a dielectric layer of the one or more dielectric layers. The further redistribution layer 1030 may also include one or more electrical vias in electrical connection with the one or more electrically conductive lines. For instance, a first electrical conductive line may be electrically connected to a second electrical conductive line via an electrical via. The one or more electrically conductive lines may be embedded in the one or more dielectric layers.

A portion of the mold structure 1008 may be removed, for instance via backgrinding, so that the electrically conductive pillar 1014 is exposed, before forming the further redistribution layer 1030 on the molded package 1028. The further redistribution layer 1030 may be formed such that the mold structure 1008 is between the redistribution layer 1002 and the further redistribution layer 1030. A first side of the mold structure 1008 may be in contact with the redistribution layer 1002, and a second side of the mold structure 1008 opposite the first side may be in contact with the further redistribution layer 1030. The redistribution layer 1002 may be in electrical connection with the further redistribution layer 1030 via the electrically conductive pillar 1014.

The carrier 1012 may also be separated from the molded package 1028. As the PIC die 906 is configured for optical vertical coupling, dicing of the molded package 1028 may not be required.

The method may further include forming solder bumps or balls 1030 so that a solder bump or ball 1030 is formed in contact with each of the one or more bond pads, thereby forming a photonic integrated circuit package 1000 according to various embodiments.

The photonic integrated circuit package 1000 may include a redistribution layer (RDL) 1002. The photonic integrated circuit package 1000 may also include a stop-ring structure 1004 in contact with the redistribution layer 1002. The photonic integrated circuit package 1000 may further include a photonic integrated circuit die 1006 in contact with the stop-ring structure 1004. The photonic integrated circuit package 1000 may further include a mold structure 1008 at least partially covering the photonic integrated circuit die 1006. The photonic integrated circuit die 1006 may include an optical coupler 1024 for optical vertical coupling.

Figure 11A:
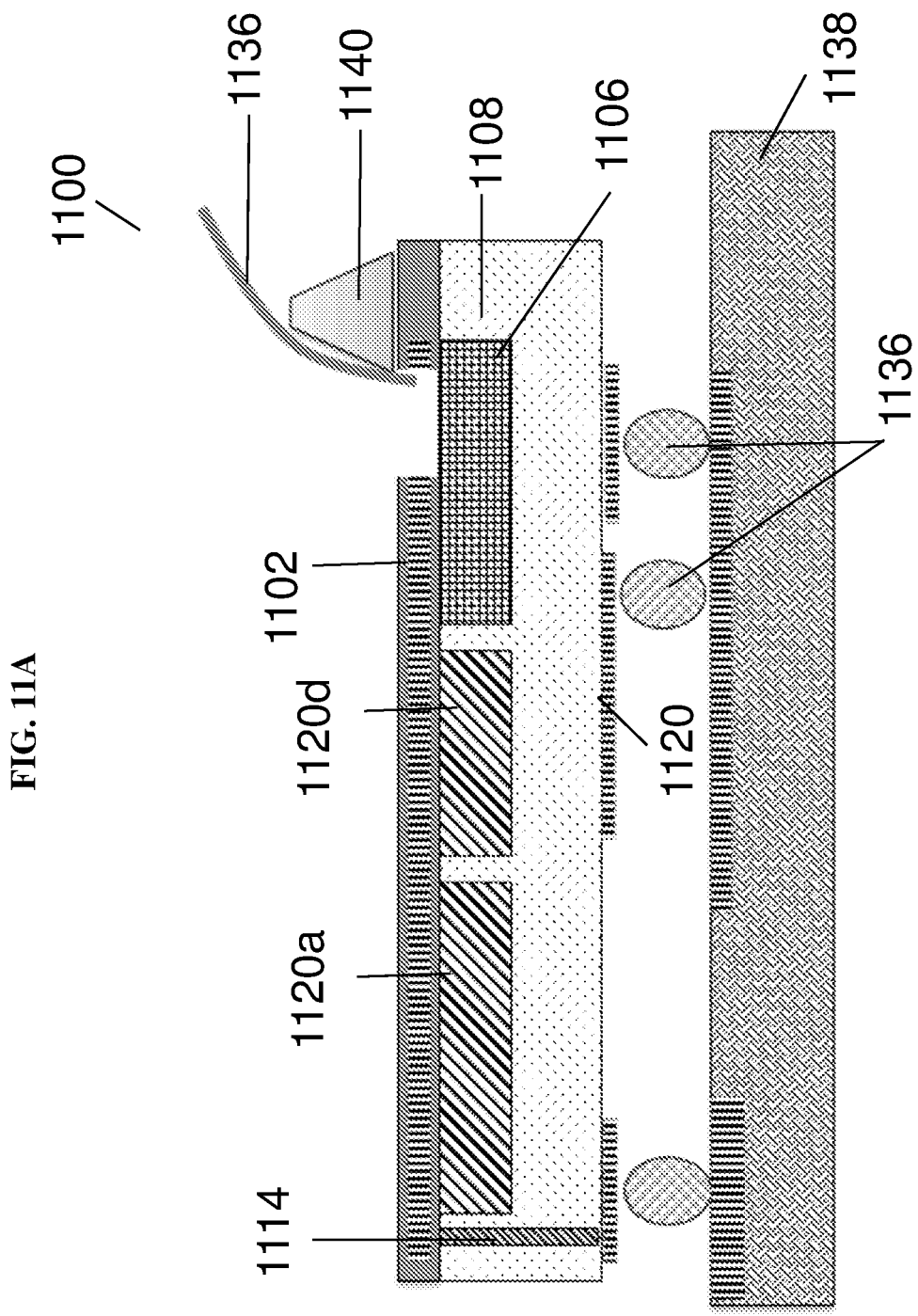
FIG. 11A is a schematic showing a cross-sectional side view of an opto-electronic system according to various embodiments.
Figure 11B:
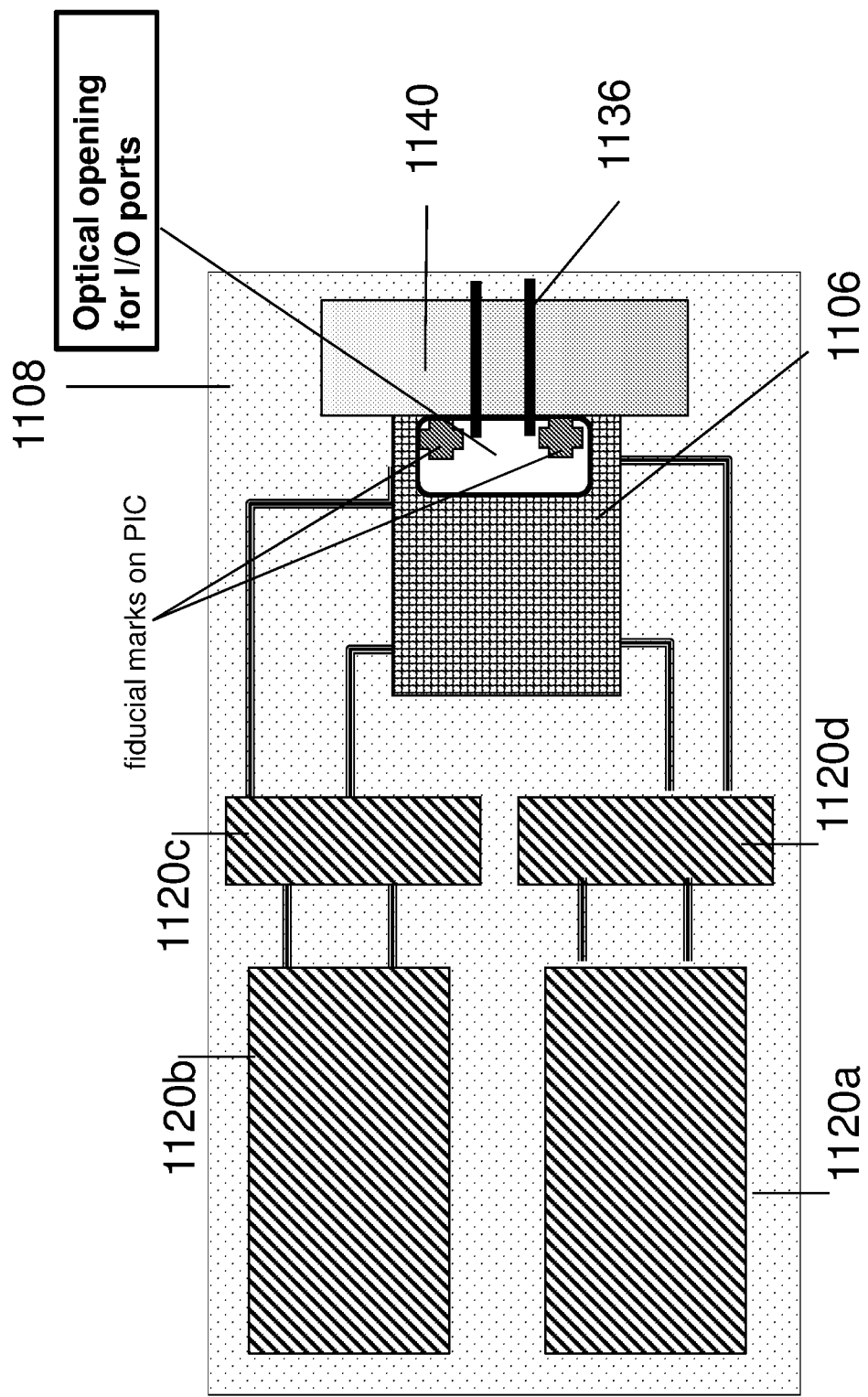
FIG. 11B is a schematic showing a top view of the opto-electronic system shown in FIG. 11A according to various embodiments.

FIG. 11A is a schematic showing a cross-sectional side view of an opto-electronic system according to various embodiments. FIG. 11B is a schematic showing a top view of the opto-electronic system shown in FIG. 11A according to various embodiments. For the sake of clarity and avoid clutter, not all like elements have been labelled.

The opto-electronic system may include a photonic integrated circuit package 1100 including a photonic integrated circuit (PIC) die 1106, a PAM4/SERDES dice 1120*a-b*, a driver die 1120*c*, a TIA die 1120*d*, a redistribution layer (RDL) 1102, an electrically conductive pillar 1114, and a mold structure 1108. The PAM4/SERDES die 1120*a* may be coupled to the TIA die 1120*d*, while the PAM4/SERDES die 1120*b* may be coupled to the driver die 1120*c*. The driver die 1120*c* and the TIA die 1120*d* may be coupled to the PIC die 1106. The photonic integrated circuit package 1100 may further include a fiber holder 1140 on the RDL 1102 for holding the fiber 1136. The fiber holder 1140 may be assembled on the FOWLP. The fiber holder 1140 may be aligned with respect to the photonic integrated circuit die 1106 (via fiducial marks on the die 1106). An optical opening may be formed to expose the optical/grating coupler in the PIC die 1106 (e.g. via etching through back end of line (BEOL) or through RDL). The BEOL metallization and RDL may be completely removed at the optical opening.

An RDL first process may be developed using a method described herein according to various embodiments. The package 1100 may be mounted on a substrate 1138 via solder bumps 1136.

Various embodiments may relate to packaging of a PIC die using fan-out wafer level packaging (FOWLP) with optical access, e.g. edge coupling.

In various embodiments, in addition to electrical connection, the fan-out (FO) area may be used to provide mechanical support, e.g. for vertical coupling.

Various embodiments may relate to using RDL first process with stop-ring design to prevent the underfill from flowing into the PIC optical I/O (top protection). In various embodiments, the optical circuit in the PIC may be designed with redundant section so that the contamination level during embedding is minimum or reduced (side protection).

In various embodiments, one or more sides of the FOWLP may be "cut" to expose the edge optical I/O.

Various embodiments may be capable of integrating EPIC using FOWLP.

Various embodiments may relate to a method of forming a cost effective FOWLP for EPIC. The PIC and the EIC may be first integrated, and may be covered in the mold compound. The PIC may be designed with the optical I/O interface at the side with an extra buffer area. The optical I/O may then be exposed by dicing away the PIC buffer area together with its surrounding mold compound.

Using the FOWLP technology may allow three-dimensional (3D) integration of the PIC, and may at the same time increase the speed of electrical signals. FOWLP is an established cost-effective technology suitable for high speed electrical integration.

The FOWLP mold compound material may be a good dielectric material, and may have low electrical loss.

Various embodiments may have multi channels. High density RDL layers and TMV or TCP may allow for 3D integration.

Various embodiments may have a low profile for edge optical coupling.

Various embodiments may be cost effective. Various embodiments may reduce PIC chip size. In various embodiments, the FOWLP may have a lower cost as compared to Si optical interposer.

In various embodiments, the bulky fiber holder for the vertical coupling may be designed at the FOWLP instead of the PIC.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of forming a photonic: integrated circuit package, the method comprising:
   forming a redistribution layer over a carrier;
   forming a through hole or cavity on the redistribution layer;
   providing a stop-ring structure, the stop-ring structure comprising a ring of suitable material, the stop-ring structure defining a hollow space, over the redistribution layer so that the hollow space is over the through hole or cavity;
arranging a photonic integrated circuit die over the redistribution layer so that the photonic integrated circuit die is on the stop-ring structure;
forming a molded package by forming a mold structure to at least partially cover the photonic integrated circuit die to form the photonic integrated circuit package; and
dicing the molded package to form the photonic integrated circuit package;
wherein dicing the molded package comprises dicing the photonic integrated circuit die and the stop-ring structure.

2. The method according to claim 1,
wherein the photonic integrated circuit die comprises one or more optical couplers; and
wherein arranging the photonic integrated circuit die over the redistribution layer comprises arranging the photonic integrated circuit die so that the one or more optical couplers are at least partially exposed to the hollow space of the stop-ring structure.

3. The method according to claim 1,
wherein the photonic integrated circuit die and the stop-ring structure are diced in such a manner that a surface of the diced stop-ring structure exposed by dicing is perpendicular to the one or more optical couplers of the diced photonic integrated circuit die.

4. The method according to claim 1,
wherein the photonic integrated circuit die comprises one or more optical couplers;
wherein the one or more optical couplers of the diced photonic integrated circuit die are perpendicular to a lateral surface of the diced photonic integrated circuit die; and
wherein the lateral surface is exposed by dicing of the photonic integrated circuit die.

5. The method according to claim 4,
where the diced stop-ring structure and the one or more couplers define a space configured to accommodate an end of an optical fiber.

6. The method according to claim 1,
wherein the molded package is diced to remove a first end portion and to remove a second end portion opposite the first end portion.

7. The method according to claim 1, further comprising:
forming interconnects to electrically connect the photonic integrated circuit die to the redistribution layer.

8. The method according to claim 1, further comprising:
arranging one or more electrical integrated circuit dies over the redistribution layer; and
wherein forming the molded package also comprises forming the mold structure to also at least partially cover the one or more electrical integrated circuit dies.

9. The method according to claim 1,
wherein forming the molded structure comprises forming a through mold via (TMV) or a through mold interconnect (TMI).

10. The method according to claim 1, further comprising:
arranging an electronic integrated circuit over the redistribution layer;
wherein forming the molded package also comprises forming the mold structure to also at least partially cover the electronic integrated circuit die.

11. The method according to claim 1, further comprising:
depositing underfill after providing the stop-ring structure over the redistribution layer.

12. A photonic integrated circuit package comprising:
a redistribution layer;
a stop-ring structure over the redistribution layer; and
a photonic integrated circuit die over the redistribution layer so that the photonic integrated circuit die is on the stop-ring structure; and
a mold structure at least partially covering the photonic integrated circuit die;
wherein the redistribution layer is a diced redistribution layer;
wherein the stop-ring structure is a diced stop-ring structure;
wherein the photonic integrated circuit die is a diced photonic integrated circuit die; and
wherein the mold structure is a diced mold structure.

13. The photonic integrated circuit package according to claim 12,
wherein the diced photonic integrated circuit die comprises one or more optical couplers;
wherein a lateral surface of the diced stop-ring structure is perpendicular to the one or more optical couplers; and
wherein the diced stop-ring structure and the one or more optical couplers define a space configured to accommodate an end of an optical fiber.

14. The photonic integrated circuit package according to claim 13, further comprising:
a further diced stop-ring structure over the diced redistribution layer;
wherein the diced photonic integrated circuit die due comprises one or more further optical couplers;
wherein a lateral surface of the further diced stop-ring structure is perpendicular to the one or more further optical couplers; and
where the further diced stop-ring structure and the one or more further optical couplers define a further space configured to hold an end of a further optical fiber.

15. The photonic integrated circuit package according to claim 12, further comprising:
an electrical integrated circuit die over the redistribution layer;
wherein the electrical integrated circuit die is electrically coupled to the photonic integrated circuit die; and
wherein the mold structure also covers the electrical integrated circuit.

16. The photonic integrated circuit package according to claim 15, further comprising:
a driver over the redistribution layer;
wherein the electrical integrated circuit die is electrically coupled to the photonic integrated circuit die via the driver.

17. The photonic integrated circuit package according to claim 15, further comprising:
an amplifier over the diced redistribution layer;
wherein the electrical integrated circuit die is electrically coupled to the diced photonic integrated circuit die via the amplifier.

18. An opto-electronic system comprising:
a substrate; and
a photonic integrated circuit package over the substrate;
wherein the photonic integrated circuit package comprises:
a redistribution layer;
a stop-ring structure over the redistribution layer;
a photonic integrated circuit die over the redistribution layer so that the photonic integrated circuit die is on the stop-ring structure; and a mold structure at least partially covering the photonic integrated circuit die;
wherein the redistribution layer is a diced redistribution layer;
wherein the stop-ring structure is a diced stop-ring structure;
wherein the photonic integrated circuit die is a diced photonic integrated circuit die; and
wherein the mold structure is a diced mold structure.

* * * * *